(12) United States Patent
Harada et al.

(10) Patent No.: US 7,135,742 B1
(45) Date of Patent: Nov. 14, 2006

(54) INSULATED GATE TYPE SEMICONDUCTOR DEVICE AND METHOD FOR FABRICATING SAME

(75) Inventors: Akihiko Harada, Kawasaki (JP);
Sadanori Akiya, Kawasaki (JP);
Kazuhiro Furuya, Kawasaki (JP);
Hisashi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/717,143

(22) Filed: Nov. 22, 2000

(30) Foreign Application Priority Data

Feb. 8, 2000 (JP) .............................. 2000-029928

(51) Int. Cl.
*H01L 27/01* (2006.01)
(52) U.S. Cl. ...................... 257/347; 257/407; 257/488; 257/489; 257/490
(58) Field of Classification Search ................ 257/347, 257/348, 349, 353, 354, 409, 410, 412, 413
See application file for complete search history.

(56) References Cited

U.S. PATENT DOCUMENTS

| | | | | |
|---|---|---|---|---|
| 5,095,348 A | * | 3/1992 | Houston ..................... | 357/23.7 |
| 5,102,809 A | | 4/1992 | Eklund et al. | |
| 5,294,823 A | | 3/1994 | Eklund et al. | |
| 5,422,505 A | * | 6/1995 | Shirai ......................... | 257/327 |
| 5,498,882 A | * | 3/1996 | Houston ....................... | 257/57 |
| 5,607,865 A | * | 3/1997 | Choi et al. ................... | 438/164 |
| 5,610,430 A | * | 3/1997 | Yamashita et al. .......... | 257/412 |
| 5,637,899 A | * | 6/1997 | Eimori et al. ............... | 257/347 |
| 5,741,737 A | * | 4/1998 | Kachelmeier ................ | 438/286 |
| 5,918,133 A | * | 6/1999 | Gardner et al. ............. | 438/299 |
| 5,973,364 A | * | 10/1999 | Kawanaka ................... | 257/347 |
| 6,100,564 A | * | 8/2000 | Bryant et al. ............... | 257/347 |
| 6,154,091 A | * | 11/2000 | Pennings et al. ............ | 327/565 |
| 6,252,280 B1 | * | 6/2001 | Hirano ........................ | 257/347 |
| 6,307,237 B1 | * | 10/2001 | Erstad ......................... | 257/401 |
| 6,403,405 B1 | * | 6/2002 | Kawanaka et al. .......... | 438/151 |
| 6,521,948 B1 | * | 2/2003 | Ebina .......................... | 257/347 |
| 6,555,446 B1 | * | 4/2003 | Unnikrishnan .............. | 438/459 |
| 6,620,656 B1 | * | 9/2003 | Min et al. .................... | 438/149 |
| 2001/0038123 A1 | * | 11/2001 | Yu ............................... | 257/347 |
| 2005/0001254 A1 | * | 1/2005 | Hidaka et al. ............... | 257/296 |

FOREIGN PATENT DOCUMENTS

| | | | |
|---|---|---|---|
| JP | 60-91676 | * | 5/1985 |
| JP | 1-293533 | | 11/1989 |
| JP | 5-343681 | * | 12/1993 |
| JP | 8-125187 | | 5/1996 |
| JP | 8 125187 | * | 5/1996 |
| JP | 10-242470 | * | 9/1998 |
| JP | 11-54759 | * | 2/1999 |
| JP | 11-274499 | * | 10/1999 |

(Continued)

*Primary Examiner*—Nathan J. Flynn
*Assistant Examiner*—Ahmed N. Sefer
(74) *Attorney, Agent, or Firm*—Westerman, Hattori, Daniels & Adrian, LLP.

(57) ABSTRACT

An insulated gate type semiconductor device comprised of a semiconductor layer serving as an active region isolated from a semiconductor substrate by a substrate isolation insulating film and a T-shaped gate electrode comprised of a trunk-shaped main gate electrode and a crosspiece-shaped conductor pattern provided on the semiconductor layer, wherein the thickness of the gate insulating film directly under the crosspiece-shaped conductor pattern is made greater than the thickness of the gate insulating film directly under the main gate electrode, whereby it is possible to prevent short-circuits between electrodes, prevent short-circuits between separators, and prevent an increase of the parasitic capacitance.

4 Claims, 16 Drawing Sheets

FOREIGN PATENT DOCUMENTS

| | | | |
|---|---|---|---|
| JP | 2000-294794 | * | 10/2000 |
| JP | 2001-298195 | * | 10/2001 |

* cited by examiner

INSULATED GATE TYPE SEMICONDUCTOR DEVICE AND METHOD FOR FABRICATING SAME

BACKGROUND OF THE INVENTION

1. Field of the Invention

The present invention relates to an insulated gate type semiconductor device and a method for fabricating the same, more particularly relates to an insulated gate type semiconductor device designed to prevent short-circuits, an increase in parasitic capacitance, and an increase in chip size accompanying the formation of a body contact region in a metal-oxide semiconductor field effect transistor (MOSFET) or other insulated gate type semiconductor (IGFET) using a silicon-on-insulator (SOI) substrate and a method for fabricating the same.

2. Description of the Related Art

As will be explained in detail later using the drawings, in an SOI-MOSFET using a separator, short-circuits between the body contact electrode and source and drain electrodes are prevented by the sidewalls provided at the side faces of the separator. If the sidewalls are low in height, however, in the siliciding step, silicon diffuses in the metal film deposited on the surface of the sidewalls as well and alloys the film, so the silicide at that portion cannot be removed. Therefore, there is the problem of short-circuits between the body contact electrode and source and drain electrodes through the silicide layer.

Further, when arranging the transistors in the form of an array as in the normal state of use, when adjoining separators are different in potential, it is necessary to keep the two separated by exactly a constant distance in order to prevent short-circuits between them. Due to this, there is the problem that the chip area is increased.

Further, the width of a separator is dependent on the overlay accuracy in the photolithography step at the time of formation of the separator, the variance in finishing dimensions in the etching step of the separator, the overlay accuracy of the mask at the time of ion implantation in the step of forming the body contact region, etc. Therefore, the area occupied in one transistor becomes the same order as the gate electrode functioning for forming the channel and the parasitic capacitance increases. As a result, there is the problem that the gate delay becomes greater and the performance of the device deteriorates.

SUMMARY OF THE INVENTION

An object of the present invention is to provide an insulated gate type semiconductor device which prevents short-circuits between electrodes, prevents short-circuits between separators, and prevents an increase of the parasitic capacitance and a method for fabricating the same.

To attain the above object, the present invention provides an insulated gate type semiconductor device comprised of a semiconductor layer (3) serving as an active region isolated from a semiconductor substrate (1) by a substrate isolation insulating film (2) and a T-shaped gate electrode comprised of a trunk-shaped main gate electrode (6) and a crosspiece-shaped conductor pattern (7) provided on the semiconductor layer (3), wherein the thickness of the gate insulating film directly under the crosspiece-shaped conductor pattern (7) is made greater than the thickness of the gate insulating film directly under the main gate electrode (6), whereby it is possible to prevent short-circuits between electrodes, prevent short-circuits between separators, and prevent an increase of the parasitic capacitance.

BRIEF DESCRIPTION OF THE DRAWINGS

The above object and features of the present invention will be more apparent from the following description of the preferred embodiments given with reference to the accompanying drawings, in which.

DESCRIPTION OF THE PREFERRED EMBODIMENTS

Before describing the embodiments of the present invention, the related art and the disadvantages therein will be described with reference to the related figures.

In an MOS type semiconductor device of the related art, by storing carriers in a semiconductor region where a channel region is to be formed directly under the gate electrode, the threshold voltage $V_{th}$ and the drain current $I_{ds}$ sometimes fluctuate and the semiconductor region enters a floating state. The above fluctuation becomes a problem in an SOI-MOS type semiconductor device, in particular a partially depleted (PD) SOI-MOS type semiconductor device with an incompletely depleted semiconductor region.

To prevent such fluctuations in the threshold voltage $V_{th}$ etc., the practice in the related art had been to drain the stored carriers by forming a body contact with the semiconductor region where the channel region is to be formed. Here, an explanation will be given of a MOS type semiconductor device provided with a body contact region of the related art with reference to FIG. 15 FIG. 16.

Figure 15:
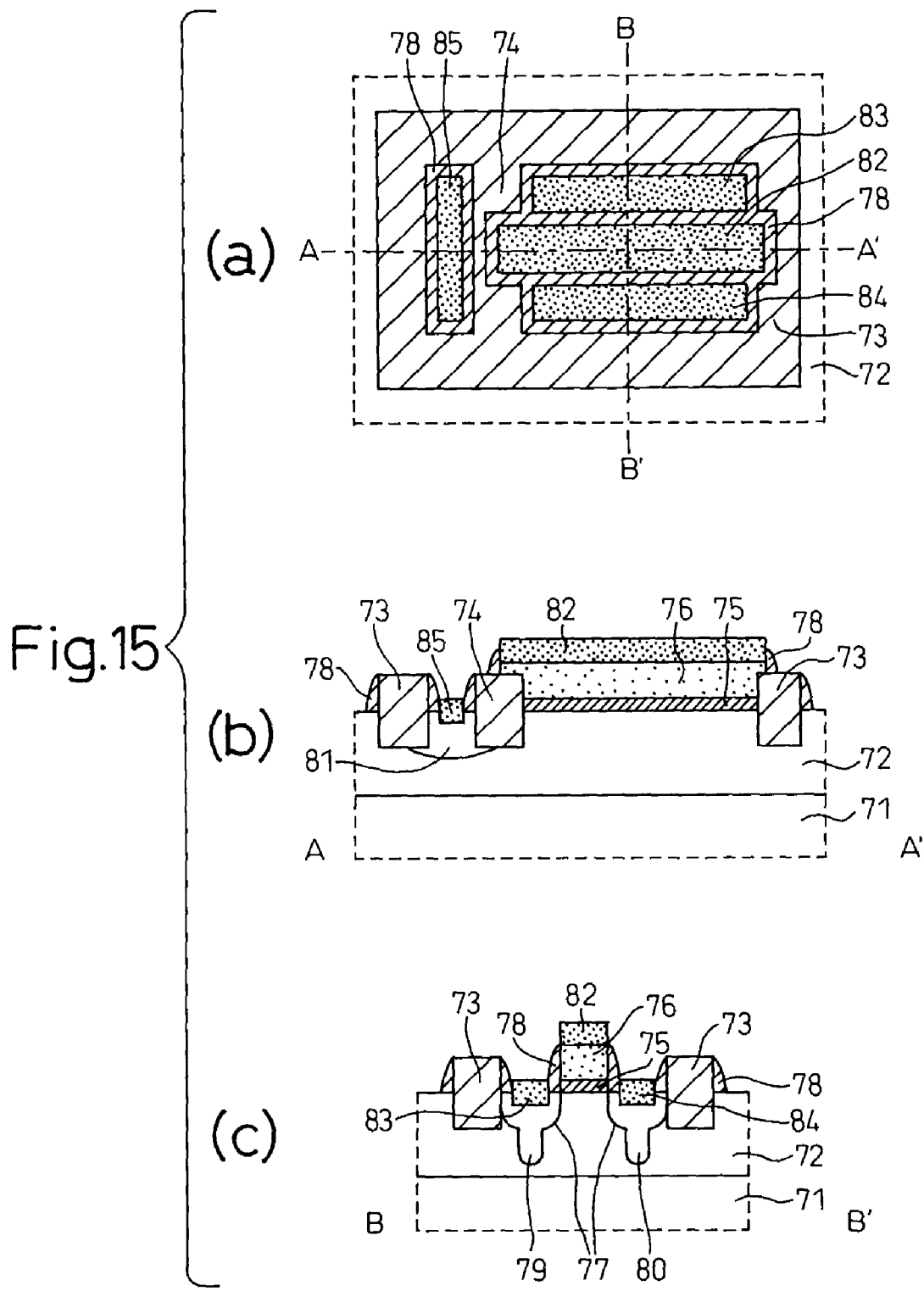
FIG. 15 is an explanatory view of a MOSFET of the related art.

FIG. 15 is an explanatory view of an example of a MOSFET of the related art. FIG. 15($a$) is a plan view, FIG. 15($b$) is a sectional view along the one-dot chain line connecting A–A' in FIG. 15($a$), and FIG. 15($c$) is a sectional view along the one-dot chain line connecting B–B' in FIG. 15($a$).

In this case, only an n-channel type MOSFET is shown, but in the case of a p-channel type MOSFET, the structure is substantially the same. The only difference lies in the conductivity type, i.e., the impurity used.

First, a p-type well region 72 is formed at the surface side of the p-type silicon substrate 71. An element isolation oxide film 73 surrounding the element formation region is formed using the selective oxidation (LOCOS) method or shallow trench isolation (STI) method. At the same time, an intra-element isolation oxide film 74 is formed for isolating the body contact region.

Next, a gate oxide film 75 is formed on the exposed surface of the p-type well region 72, then an electrode coating such as an amorphous silicon film is deposited over the entire surface, conductivity is imparted by ion implantation etc, then a gate electrode 76 is formed by etching. Next, phosphorus or other n-type impurity ions are implanted using the gate electrode 76 as a mask so as to form an extended diffusion region 77.

Next, an $SiO_2$ film is deposited over the entire surface, then this is anistropically etched to form sidewalls 78 at the side faces etc. of the gate electrode 76. Next, in the state with the body contact formation region masked by a resist, phosphorus ions are implanted using the gate electrode 76 and the sidewalls 78 as a mask to form the n-type source region 79 and the n-type drain region 80.

Next, while masking the n-type source region 79 and the n-type drain region 80 by a resist, boron ions are implanted in the body contact formation region to form the body contact region 81. Next, a cobalt film is deposited over the entire surface, then heat treatment is performed to silicide it and form a silicide layer comprised of CoSi and $CoSi_2$ on the exposed silicon region.

Next, the unreacted cobalt film is selectively removed, then heat treatment is performed again to convert the CoSi in the silicide layer to $CoSi_2$ and form the $CoSi_2$ layers 82 to 85. This completes the basic configuration of the MOS type semiconductor device having the body contact electrode.

Note that the $CoSi_2$ layer 83 forms the source electrode, the $CoSi_2$ layer 84 forms the drain electrode, and the $CoSi_2$ layer 85 forms the body contact electrode.

Along with the higher integration degrees and higher speeds of semiconductor devices in recent years, elements have become miniaturized and the parasitic capacitance with respect to the substrate has been decreased, so attention has focused on MOS type semiconductor devices using SOI substrates with active element regions insulated and isolated from the substrate. In this type of SOI-MOS type semiconductor device, however, the active element region is completely insulated and isolated and thus brought in a floating state, so, in the case of FIG. 15, it becomes impossible to control the potential directly under the gate electrode by the body contact region through the well region.

Therefore, in the SOI-MOS type semiconductor device of the related art, it has been proposed to provide a semiconductor region having a channel formed in the gate width direction of the gate electrode (that is, the direction vertical to the longitudinal direction of the channel) and a projecting island region of the same conductivity type and provide a body contact electrode in the island region (see for example, Japanese Unexamined Patent Publication (Kokai) No. 8-125187).

Such a projecting island region for the body contact, however, is an obstacle to miniaturization of the elements, so along with the miniaturization of elements, the body contact region has been provided near the source and drain regions by using a separator and use of a silicide electrode has been experimented with to form a contact electrode by self-alignment. An SOI-MOSFET of the related art provided with such a separator will be explained with reference to FIG. 16.

Figure 16:
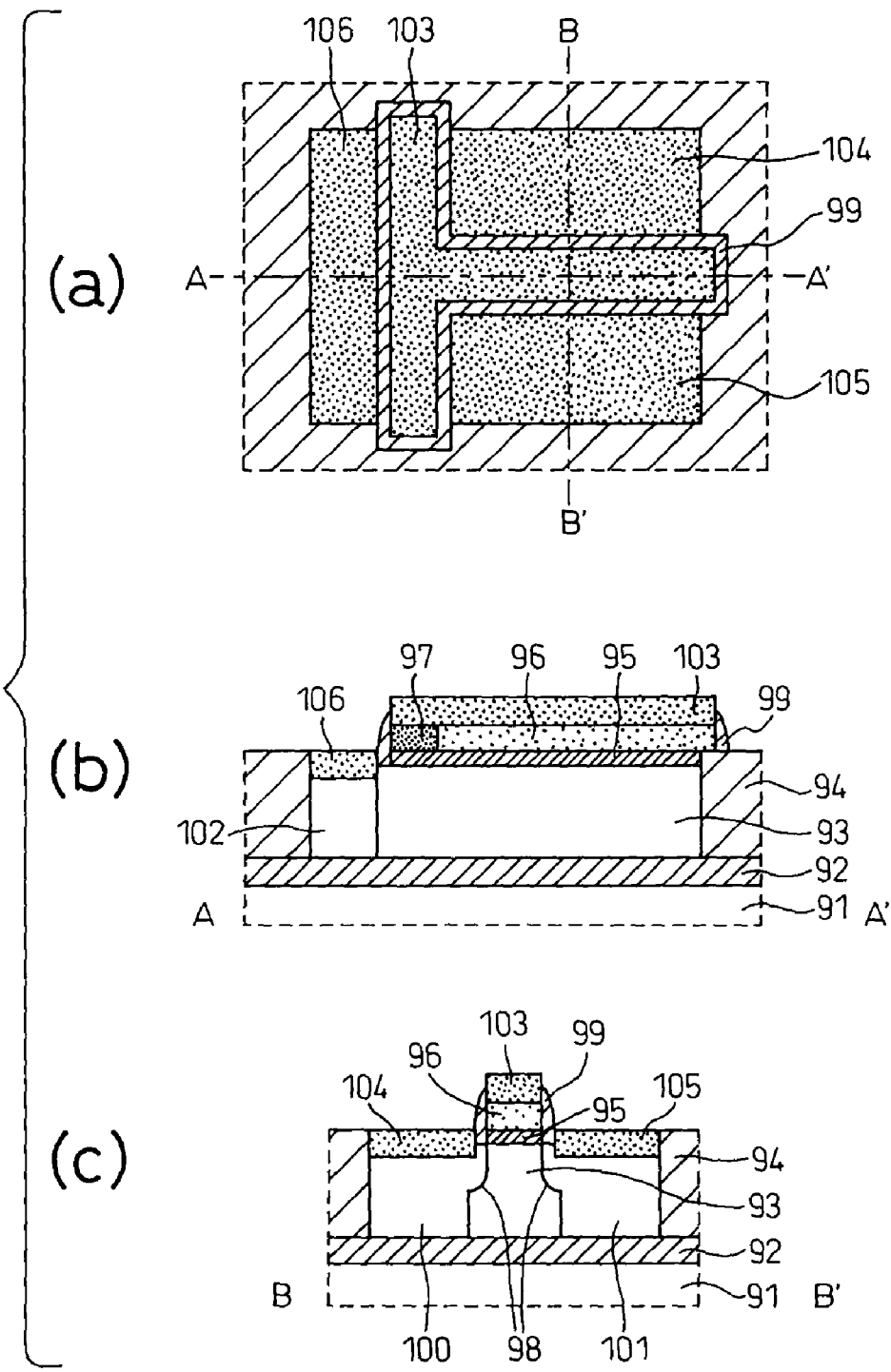
FIG. 16 is an explanatory view of an SOI-MOSFET of the related art.

FIG. 16 is an explanatory view of an example of an SOI-MOSFET of the related art. FIG. 16($a$) is a plan view, FIG. 16($b$) is a sectional view along the one-dot chain line connecting A–A' in FIG. 16($a$), and FIG. 16($c$) is a sectional view along the one-dot chain line connecting B–B' in FIG. 16($a$).

In this case, only an n-channel type MOSFET is shown, but even in the case of a p-channel type MOSFET, the structure is substantially the same. Only the conductivity type and therefore the impurity used differ.

First, oxygen ions are implanted to a predetermined depth in the silicon substrate 91, then heat treatment is performed to convert the oxygen ion implantation region to $SiO_2$ to thereby form a buried oxide (BOX), that is, the substrate isolation oxide film 92. Next, boron ions are implanted in the surface to form a p-type silicon layer 93.

Next, an element isolation oxide film 94 surrounding the element formation region is formed using the STI (Shallow Trench Isolation) method, then a gate insulating film 95 is formed over the surface of the p-type silicon layer 93. Next, an amorphous silicon film or other electrode coating film is deposited over the entire surface and ions are implanted etc. to impart conductivity, then this is etched to form a T-shaped electrode pattern.

The trunk portion of the T-shaped electrode pattern forms the gate electrode 96, while the crosspiece-shaped portion thereof forms the separator 97 which has no relation to the gate operation.

Next, ions of phosphorus or another n-type impurity are implanted, using the gate electrode 96 as a mask, to thereby form an extended diffusion region 98, then an $SiO_2$ film is deposited over the entire surface and anistropically etched to form sidewalls 99 on the side faces etc. of the gate electrode 96. Next, while masking the body contact formation region by a resist, phosphorus ions are implanted using the gate electrode 96, separator 97, and sidewalls 99 as a mask to form the n-type source region 100 and n-type drain region 101.

Next, while masking the n-type source region 100 and n-type drain region 101 by a resist, ions of $BF_2$ are implanted in the body contact formation region to form the body contact region 102, then a cobalt film is deposited over the entire surface. Next, heat treatment is performed to silicide the film and form a silicide layer comprised of CoSi and $CoSi_2$ on the exposed silicon region.

Next, the unreacted Co film is selectively removed, then heat treatment is performed again to convert the CoSi in the silicide layer to CoSi$_2$ and thereby form the CoSi$_2$ layers 103 to 106. This completes the basic configuration of the SOI-MOS type semiconductor device having a body contact electrode.

Note that the CoSi$_2$ layer 104 forms the source electrode, the CoSi$_2$ layer 105 forms the drain electrode, and the CoSi$_2$ layer 106 forms the body contact electrode.

In such an SOI-MOSFET, the separator 97 forms part of the mask at the time of ion implantation. The electrodes of the CoSi$_2$ layers 104 and 105 forming the source and drain electrodes and the CoSi$_2$ layer 106 forming the body contact electrode are separated by the sidewalls 99, so the body contact electrode and the source and drain electrodes will never short-circuit.

In this case, the p-type silicon layer 93 where the channel region is to be formed is set to a predetermined potential through the body contact region 102, so fluctuation of the V$_{th}$ is prevented. Further, the n-type source region 100 or the n-type drain region 101 contacts the body contact region 102 through the p-type silicon layer 93, so a p$^+$/n$^+$ junction is never formed. Therefore, there is no fall in the drain breakdown voltage.

As already explained, in an SOI-MOSFET using a separator, short-circuits between the body contact electrode and source and drain electrodes are prevented by the sidewalls provided at the side faces of the separator. If the sidewalls are low in height, however, in the siliciding step, silicon diffuses in the metal film deposited on the surface of the sidewalls as well to alloy the film, so the silicide at that portion cannot be removed. Therefore, there is the problem of short-circuits between the body contact electrode and source and drain electrodes through the silicide layer.

Further, when arranging the transistors in the form of an array as in the normal state of use, when adjoining separators are different in potential, it is necessary to keep the two separated by exactly a constant distance in order to prevent a short-circuit between them. Due to this, there is the problem that the chip area is increased.

Further, the width of the separator is dependent on the overlay accuracy in the photolithography step at the time of formation of the separator, the variance in finishing dimensions in the etching step of the separator, the overlap accuracy of the mask at the time of ion implantation in the step of forming the body contact region, etc. Therefore, the area occupied in one transistor becomes the same order as the gate electrode functioning for forming the channel and the parasitic capacitance increases. As a result, there is the problem that the gate delay becomes greater and the performance of the device deteriorates.

Next, embodiments of the present invention for preventing short-circuits between electrodes, preventing short-circuits between separators, and preventing an increase of the parasitic capacitance will be explained in detail.

Figure 1:
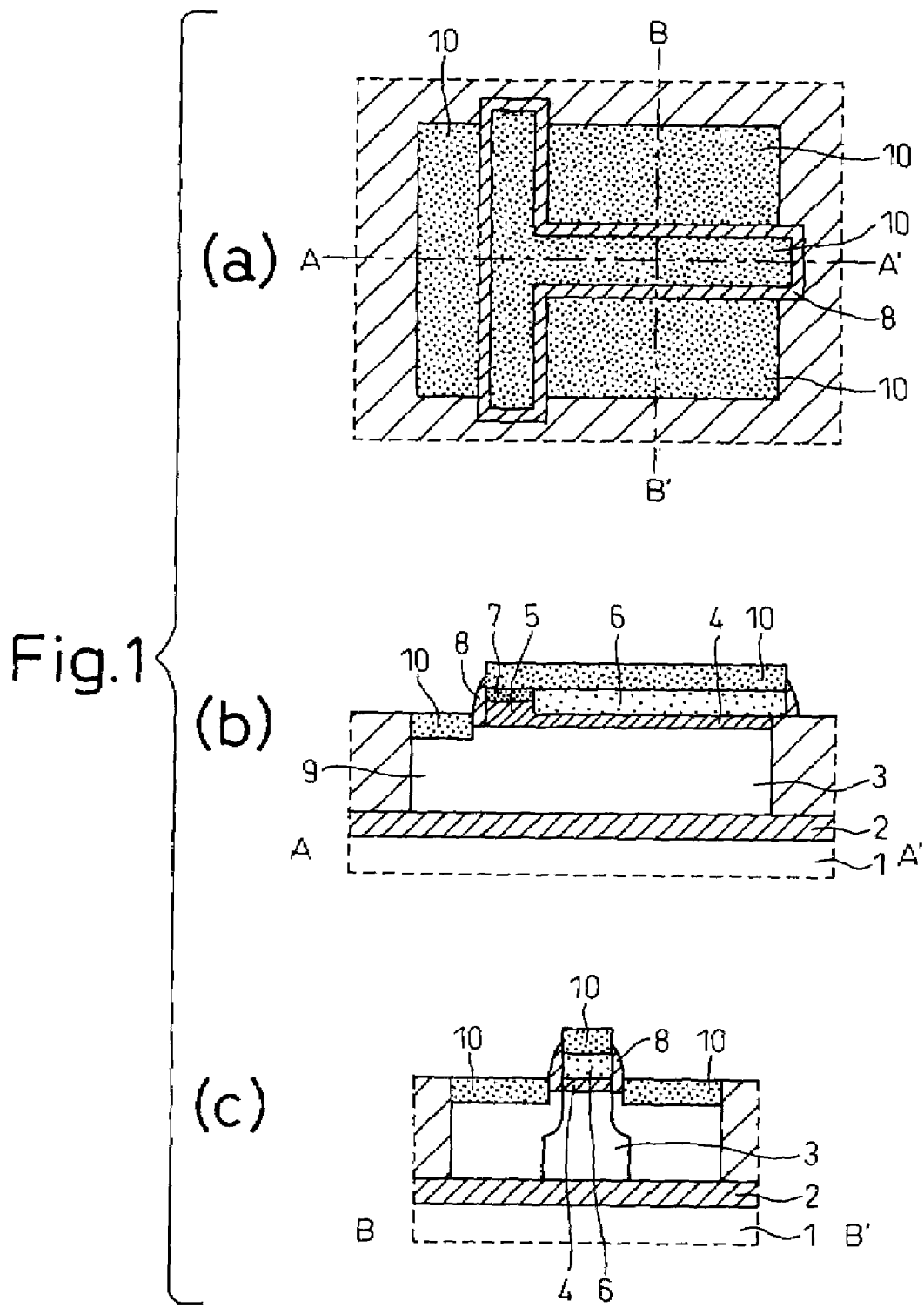
FIG. 1 is an explanatory view of the basic configuration of the present invention.
Figure 2:
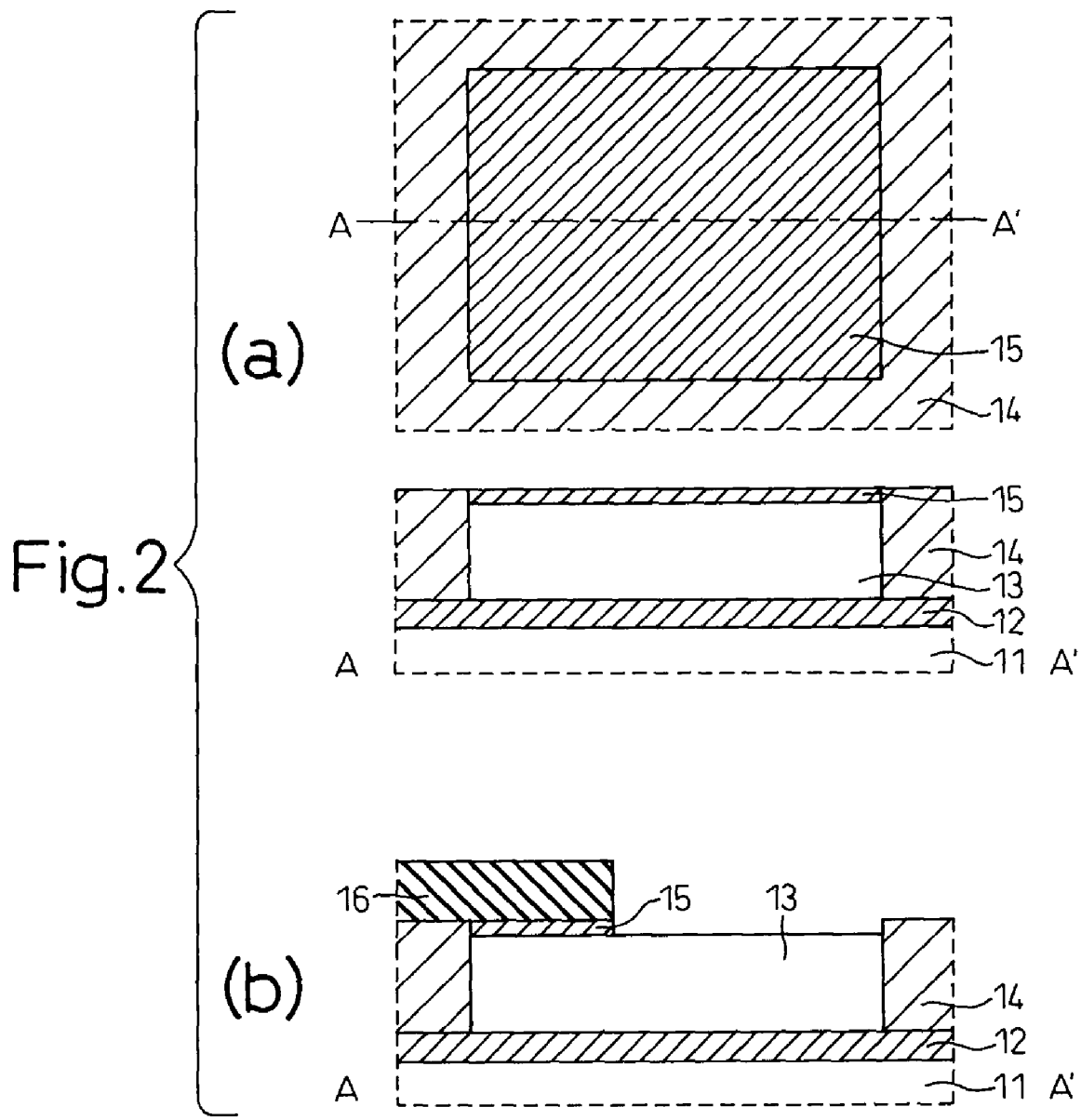
FIG. 2 is an explanatory view of the production process up to the middle of the first embodiment of the present invention.
Figure 3:
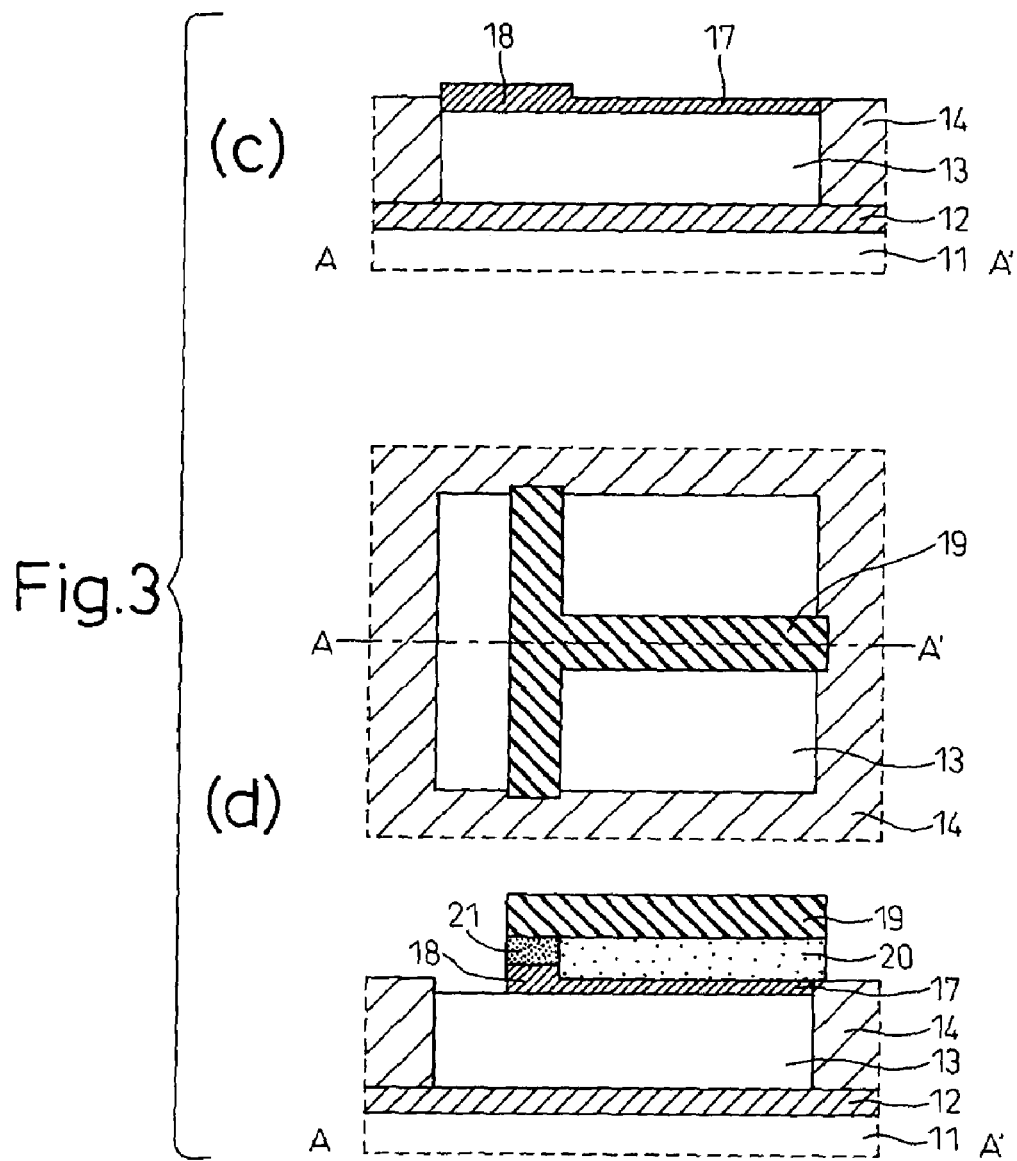
FIG. 3 is an explanatory view of the production process up to the middle of the first embodiment of the present invention after FIG. 2.
Figure 4:
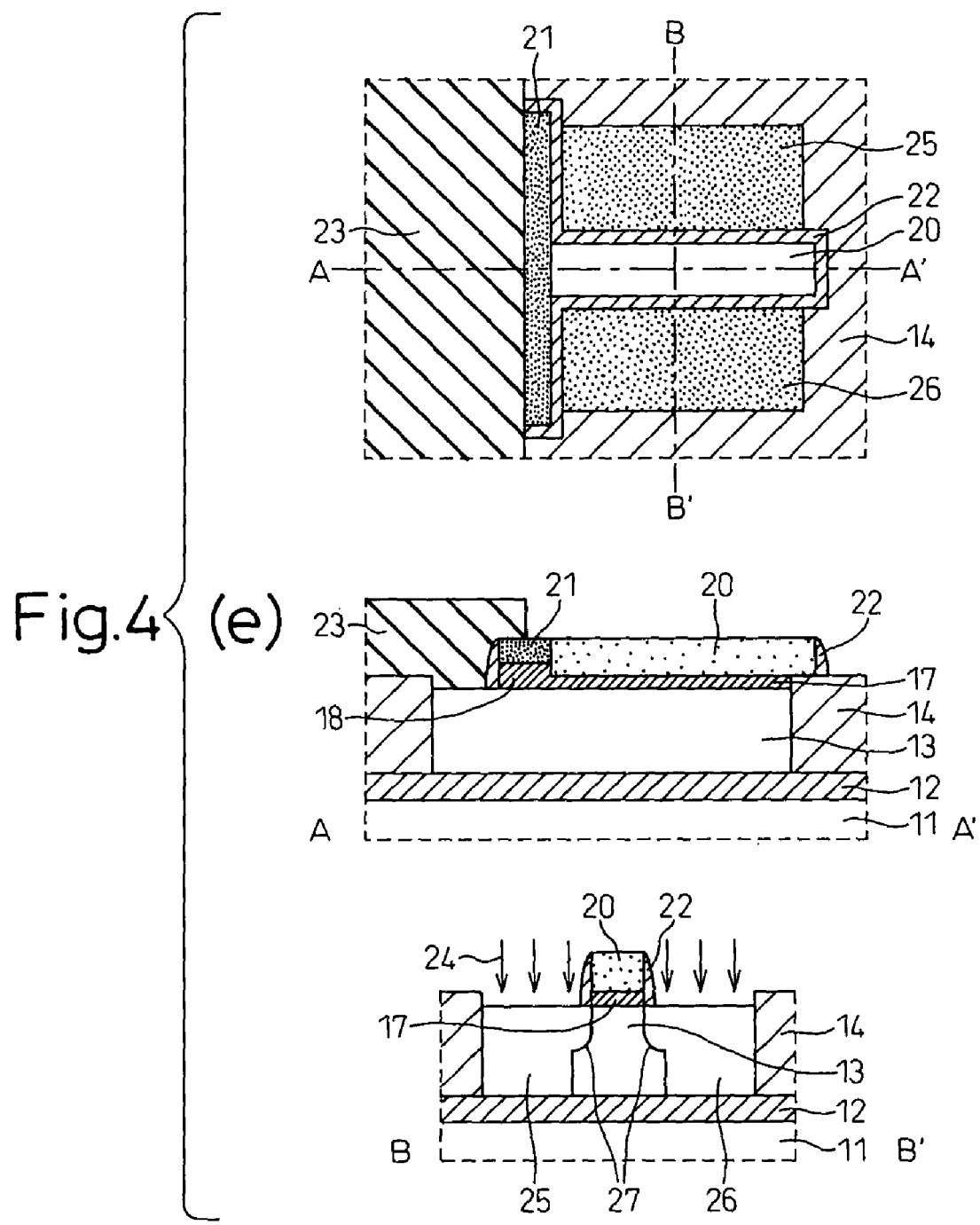
FIG. 4 is an explanatory view of the production process up to the middle of the first embodiment of the present invention after FIG. 3.
Figure 5:
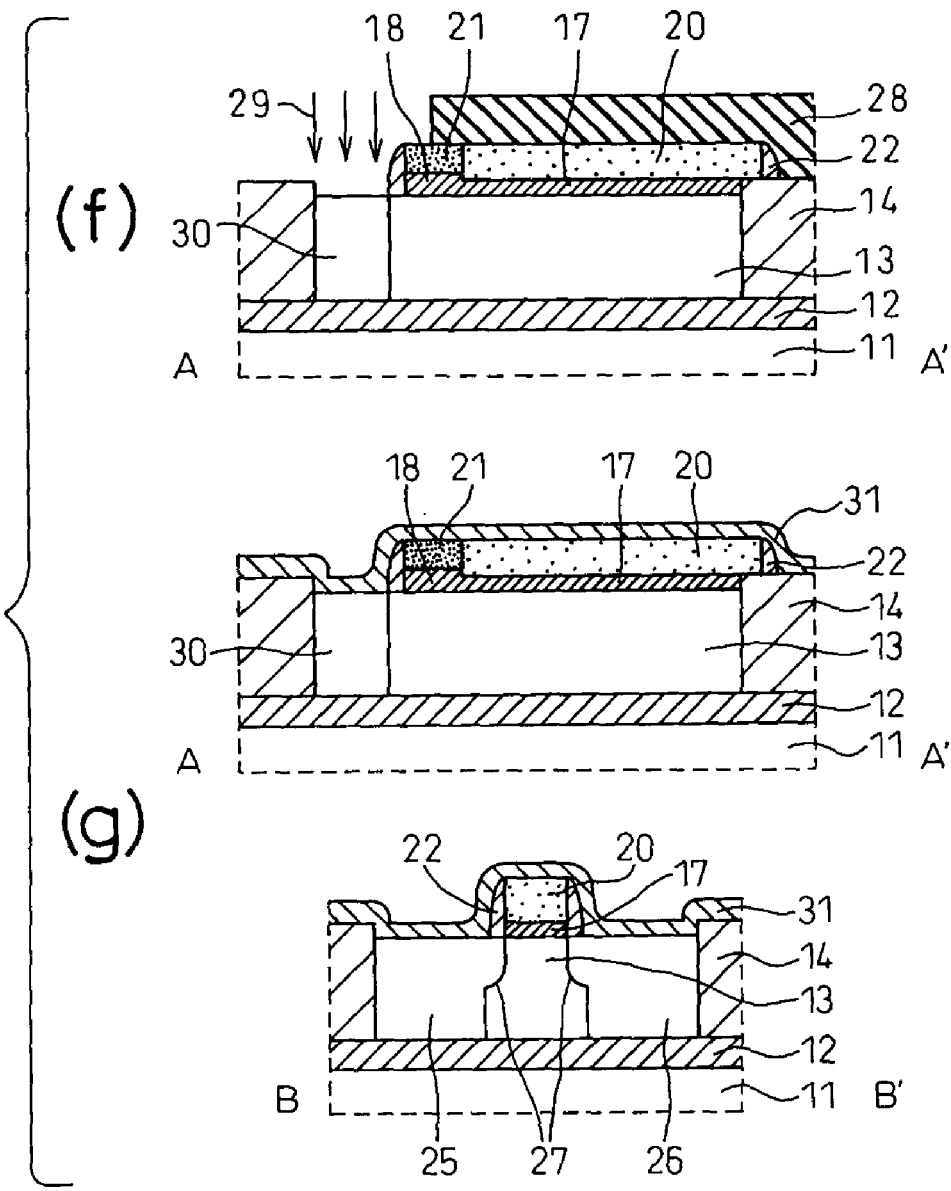
FIG. 5 is an explanatory view of the production process up to the middle of the first embodiment of the present invention after FIG. 4.
Figure 6:
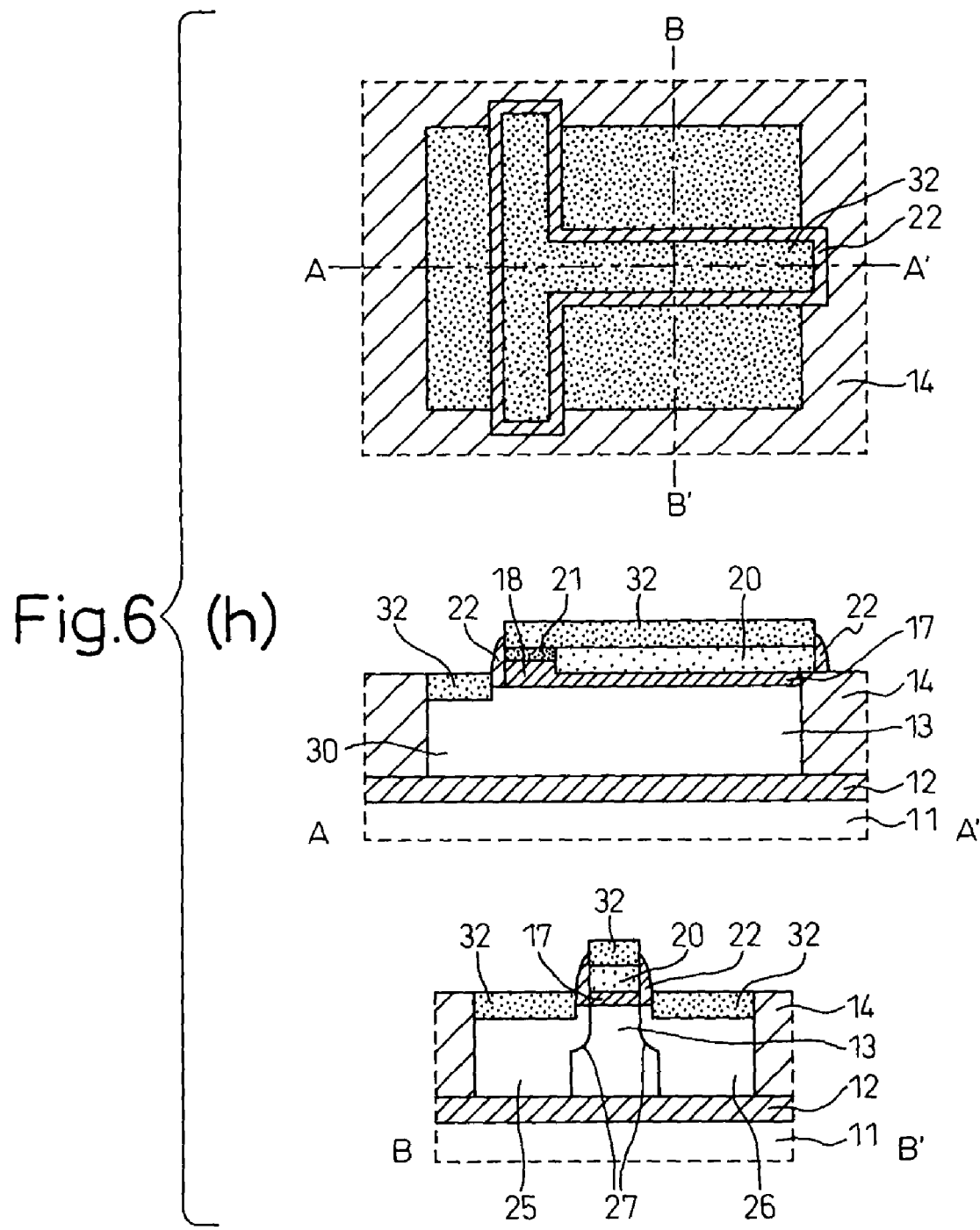
FIG. 6 is an explanatory view of the production process up to the middle of the first embodiment of the present invention after FIG. 5.

FIG. 1 is an explanatory view of the basic configuration of the present invention, where FIG. 1(a) is a plan view, FIG. 1(b) is a sectional view along the one-dot chain line connecting A–A' in FIG. 1(a), and FIG. 1(c) is a sectional view along the one-dot chain line connecting B–B' in FIG. 1(a).

The first aspect of the present invention comprises an insulated gate type semiconductor device comprised of a semiconductor layer 3 serving as an active region isolated from a semiconductor substrate 1 by a substrate isolation insulating film 2, provided with a T-shaped gate electrode comprised of a trunk-shaped main gate electrode 6 and a crosspiece-shaped conductor pattern 7 and having a thickness of the gate insulating film directly under the crosspiece-shaped conductor pattern 7 greater than the thickness of the gate insulating film 4 directly under the main gate electrode 6.

When providing a T-shaped gate electrode having a crosspiece-shaped conductor pattern 7, that is, a separator, in this way, the parasitic capacitance derived from the separator can be reduced by making the thickness of the gate insulating film directly under the crosspiece-shaped conductor pattern 7 greater than the thickness of the gate insulating film 4 directly below the main gate electrode 6, that is, by providing the thick portion 5.

Further, in the first aspect of the invention, it is preferable to provide the sidewalls 8 at the side faces of the gate electrode and provide the silicide electrode 10 at least at the exposed surface of the semiconductor layer 3.

That is, since the thick portion 5 of the gate insulating film 4 is directly below the separator, the thickness of the main gain electrode 6 becomes greater along with this, so the height of the sidewalls 8 becomes greater. Due to this, the silicide electrodes 10 are no longer connected with each other, so short-circuits between the silicide electrodes 10 can be prevented.

Further, since the separation between separators of the adjoining elements becomes more reliable due to the provision of the high sidewalls 8, an excess space for preventing short-circuits becomes unnecessary. Due to this, the pitch between transistors can be shortened.

The second aspect of the present invention comprises an insulated gate type semiconductor device comprised of a semiconductor layer 3 serving as an active region isolated from a semiconductor substrate 1 by a substrate isolation insulating film 2, wherein a thickness of an insulating film provided on a surface of a first conductivity type semiconductor region positioned at an interface between that first conductivity type body contact region 9 and a second conductivity type source and drain regions is made greater than the thickness of a gate insulating film 4 directly under a gate electrode.

By making the thickness of the insulating film provided on the surface of the first conductivity type semiconductor region positioned at the interface between the first conductivity type body contact region 9 and the second conductivity type source and drain regions greater than the thickness of the gate insulating film 4 directly below the gate electrode, a separator become unnecessary, so no parasitic capacitance derived from the separator occurs. Further, no space is needed for separating separators, the pitch between transistors can be shortened accordingly.

Further, in the second aspect of the invention, it is preferable to provide sidewalls 8 at the side faces of the gate electrode and provide a silicide electrode 10 at least at the exposed surface of the semiconductor layer 3.

That is, since the separators of the adjoining elements are reliably insulated and separated by providing the high sidewalls 8, the excess space for isolation becomes unnecessary and there is no longer a need to consider changes in the performance of a transistor at the connecting portions of the separator main gate electrode 6.

Further, since a thick insulating film, that is, the thick portion 5, is provided at the surface of the first conductivity type semiconductor region positioned at the interface between the first conductivity type body contact region 9 and the second conductivity type source and drain regions, when forming the silicide electrode 10, there is no longer any risk of the surface of the first conductivity type semiconductor region positioned at the interface between the first conductivity type body contact region 9 and the second conductivity type source and drain regions becoming silicided.

The third aspect of the present invention comprises an insulated gate type semiconductor device comprised of a semiconductor layer 3 serving as an active region isolated from a semiconductor substrate 1 by a substrate isolation insulating film 2, wherein a buried insulating film thicker than the thickness of the gate insulating film 4 directly under a gate electrode is provided on a surface of a first conductivity type semiconductor region positioned at an interface between that first conductivity type body contact region 9 and a second conductivity type source and drain regions.

By providing the buried insulating film thicker than the thickness of the gate insulating film 4 directly under the gate electrode, that is, the intra-element isolation insulating film, at the surface of the first conductivity type semiconductor region positioned at the interface between the first conductivity type body contact region 9 and the second conductivity type source and drain regions, the separator becomes unnecessary, so no parasitic capacitance derived from separators occurs and there is no longer a need to consider the change in the performance of a transistor at the connecting part of the separator and main gate electrode 6.

Further, since space for separating separators from each other is no longer necessary, reduction of the pitch between transistors becomes possible.

The fourth aspect of the present invention comprises an insulated gate type semiconductor device comprised of a semiconductor layer 3 serving as an active region isolated from a semiconductor substrate 1 by a substrate isolation insulating film 2, wherein a gate electrode of a shape of either one of an L-shape or asymmetric T-shape comprised of a trunk-shaped main gate electrode 6 and a crosspiece-shaped conductor pattern 7 is provided and a body contact region 9 and one of a source region and drain region are separated through the crosspiece-shaped conductor pattern 7.

In the case of an element using one of the source region and drain region made the same potential as the body contact region 9, since short-circuits between the separators of adjoining elements are prevented by the provision of a gate electrode of a shape of one of an L-shape or asymmetric T-shape comprised of a trunk-shaped main gate electrode 6 and a crosspiece-shaped conductor pattern 7, space for preventing short-circuits becomes unnecessary.

Further, since the length of the separator becomes shorter, the parasitic capacitance is also greatly decreased and the performance of the transistor improved.

The fifth aspect of the present invention comprises an insulated gate type semiconductor device comprised of a semiconductor layer 3 serving as an active region isolated from a semiconductor substrate 1 by a substrate isolation insulating film 2, wherein a gate electrode of a shape of either one of an L-shape or asymmetric T-shape comprised of a trunk-shaped main gate electrode 6 and a crosspiece-shaped conductor pattern 7 is provided and at least part of the crosspiece-shaped conductor pattern 7 functions as an effective gate electrode.

By making at least part of the crosspiece-shaped conductor pattern 7 comprising the L-shaped or asymmetric T-shaped gate electrode an effective gate electrode, the effective channel width is increased, so the performance of the transistor is improved.

Further, since the crosspiece-shaped conductor pattern 7 is not used as a mask at the time of forming the body contact region 9, the width of the crosspiece-shaped conductor pattern 7 can be made the same as the width of the main gate electrode 6.

Further, in the fourth and fifth aspects of the present invention, preferably provision is made of sidewalls 8 at the side faces of the gate electrode and provision is made of a silicide electrode 10 at least at the exposed surface of the semiconductor layer 3.

That is, by providing the silicide electrode 10 in this way, it is possible to integrally form the electrodes for the regions used at the same potential as the body contact region 9. On the other hand, the regions set to a different potential from the body contact region 9 can be electrically insulated by the sidewalls 8.

Further, in the first to fifth aspects of the present invention, preferably provision is made of an extended diffusion region at the semiconductor layer 3 at the side ends of the gate electrode.

That is, by providing the extended diffusion region, formation of an offset region at the side ends of the gate electrode is prevented. This is particularly effective when providing sidewalls 8.

The sixth aspect of the present invention relates to a method for fabricating an insulated gate type semiconductor device comprised of a semiconductor layer 3 serving as an active region isolated from a semiconductor substrate 1 by a substrate isolation insulating film 2, comprising the steps of providing a gate insulating film 4 partially differing in thickness on the surface of the semiconductor layer 3; providing a crosspiece-shaped conductor pattern 7 on a thick portion 5 of the gate insulating film 4 and providing a trunk-shaped main gate electrode 6 on the gate insulating film 4 to form a T-shaped gate electrode; forming sidewalls 8 on side faces of the gate electrode; doping an impurity, using the main gate electrode 6 and crosspiece-shaped conductor pattern 7 as a mask, to form source and drain regions; doping an impurity, using the crosspiece-shaped conductor pattern 7 as a mask, to form a body contact region 9; and depositing a metal film over the entire surface then performing heat treatment to form a silicide electrode 10.

By providing the crosspiece-shaped conductor pattern 7, that is, the separator, at the thick portion 5 of the gate insulating film, it is possible to increase the height of the sidewalls 8. Due to this, it is possible to prevent a silicide electrode 10 from being formed on the sidewalls 8 and therefore possible to prevent short-circuits between silicide electrodes 10.

The seventh aspect of the present invention relates to a method for fabricating an insulated gate type semiconductor device comprised of a semiconductor layer 3 serving as an active region isolated from a semiconductor substrate 1 by a substrate isolation insulating film 2, comprising the steps of providing a gate insulating film 4 partially differing in thickness on the surface of the semiconductor layer 3; providing a crosspiece-shaped conductor pattern 7 on a thick portion 5 of the gate insulating film 4 and providing a trunk-shaped main gate electrode 6 on the gate insulating film 4 to form a T-shaped gate electrode; forming sidewalls 8 on side faces of the gate electrode; doping an impurity, using the main gate electrode 6 and crosspiece-shaped conductor pattern 7 as a mask, to form source and drain regions; doping an impurity, using the crosspiece-shaped conductor pattern 7 as a mask, to form a body contact region 9; and removing the crosspiece-shaped conductor pattern 7, then depositing a metal film over the entire surface and performing heat treatment to form a silicide electrode 10.

By removing the crosspiece-shaped pattern 7, that is, the separator, forming the mask at the time of doping of the impurity, before depositing the metal film for formation of the silicide electrode 10 over the entire surface in this way, it is possible to eliminate the parasitic capacitance due to the separator.

Further, in the siliciding step, since the thick portion 5 is present at the part from which the separator was removed, the semiconductor layer 3 will not become exposed at the washing step before the step of depositing the metal film. Therefore, the silicide electrode 10 is no longer formed at the removal part.

The eighth aspect of the present invention relates to a method for fabricating an insulated gate type semiconductor device comprised of a semiconductor layer 3 serving as an active region isolated from a semiconductor substrate 1 by a substrate isolation insulating film 2, comprising the steps of forming a groove of a different depth in the surface of the semiconductor layer 3 and burying the groove by an insulator to form an element isolation insulating film and an intra-element isolation insulating film; providing a gate electrode on a gate insulating film 4; forming sidewalls on side faces of the gate electrode; doping an impurity, using the gate electrode and the intra-element isolation insulating film as a mask, to form source and drain regions; doping an impurity, using the intra-element isolation insulating film as a mask, to form a body contact region 9; and depositing a metal film over the entire surface then performing heat treatment to form a silicide electrode 10.

By separating the body contact region 9 and the source and drain regions by the intra-element isolation insulating film comprised of the buried insulator in this way, the separator becomes unnecessary, the pitch between transistors can be shortened, and it is no longer necessary to consider the changes in the transistor characteristics at the connecting part of the separator and the main gate electrode 6.

Further, in the sixth to eighth aspects of the present invention, there is preferably a step of doping an impurity and forming an extended diffusion region at the side ends of the gate electrode before forming the sidewalls 8.

That is, by forming the extended diffusion region before forming the sidewalls 8, it is possible to prevent the area directly under the sidewalls 8 from becoming offset regions.

Next, embodiments of the present invention will be explained.

Here, the explanation will be given of the process of production of an SOI-MOSFET according to a first embodiment of the present invention with reference to FIG. 2 to FIG. 6. To simplify the explanation, the explanation will be given of the process of production of an n-channel type MOSFET.

In FIG. 2(a), the top view is a plan view, while the bottom views are sectional views along the one-dot chain line connecting A–A' of the plan view.

First, oxygen ions are implanted to a predetermined depth in the silicon substrate 11, then heat treatment is performed to convert the oxygen ion implanted region to $SiO_2$ and form the substrate isolation oxide film 12. Next, by implanting boron ions in the surface of the substrate, a p-type silicon layer 13 is formed.

Next, an element isolation oxide film 14 is formed around the element formation region using the STI method. Next, the surface of the p-type silicon layer 13 is heat oxidized to form the gate insulating film 15.

Next, in FIG. 2(b), the film is wet etched, using the resist pattern 16 covering the body contact formation region as a mask, so as to remove the exposed portion of the gate insulating film 15.

Next, in FIG. 3(c), the resist pattern 16 is removed, then heat oxidation is used to form a gate insulating film 17 of a thickness of for example 4 nm.

At this time, the remainder of the gate insulating film 15 becomes a thick portion 18 of a thickness of for example 7.5 (4+3.5) nm by an extra 3.5 nm, whereby a difference in thickness is formed at the gate insulating film 17.

In FIG. 3(d), the upper view is a plan view, while the lower view is a sectional view along the one-dot chain line connecting A–A' of the plan view.

Next, an amorphous silicon film of a thickness of for example 180 nm is deposited over the entire surface, then phosphorus ions are implanted. Next, this is annealed to convert this to an n-type polycrystalline silicon film, then this film is dry etched, using the T-shaped resist pattern 19 as a mask, to form a trunk-shaped gate electrode 20 of a width of for example 0.18 μm and a crosspiece-shaped separator 21 of a width of for example 0.50 μm.

Next, this is wet etched to remove the exposed parts of the gate insulating film 17 and the thick portion 18 to expose the surface of the p-type silicon layer 13.

Note that in this figure, the separator 21 and the gate electrode 20 are shown by different patterns, but these are comprised by the same n-type polycrystalline silicon film.

In FIG. 4(e), the top view is a plan view, the middle view is a sectional view along the one-dot chain line connecting A–A' of the plan view, and the bottom view is a sectional view along the one-dot chain line connecting B–B' of the plan view.

Next, the body contact formation region is covered by a resist pattern (not shown), then phosphorus ions are implanted. Due to this, an n-type extended diffusion region 27 is formed directly under the side ends of the gate electrode 20.

Next, an $SiO_2$ film is deposited over the entire surface, then this is anistropically etched to form sidewalls 22 on the side faces of the gate electrode 20 and the separator 21. Next, while masking the body contact formation region by the resist pattern 23, phosphorus ions 24 are implanted using the gate electrode 20, separator 21, and sidewalls 22 as a mask to form the n-type source region 25 and n-type drain region 26.

Next, in FIG. 5(f), the resist pattern 23 is removed. Then, while masking the n-type source region 25 and the n-type drain region 26 by the resist pattern 28, boron ions 29 are implanted to form the body contact region 30.

In FIG. 5(g), the top view is a sectional view along A–A', while the bottom view is a sectional view along B–B'.

Next, the resist pattern 28 is removed, then the remainder is washed. Next, a cobalt film 31 is deposited over the entire surface using the sputtering method.

In FIG. 6(h), the top view is a plan view, the middle view is a sectional view along the one-dot chain line connecting A–A' of the plan view, and the bottom view is a sectional view along the one-dot chain line connecting B–B' of the plan view.

Next, rapid thermal annealing (RTA) is performed in an $N_2$ atmosphere to cause a reaction between the cobalt film 31 and silicon and form a CoSi layer. Next, this is etched using a mixture of $H_2SO_4:H_2O_2=3:1$ to remove the unreacted cobalt film on the insulating films of the element isolation oxide film 14, sidewalls 22, and so on.

Next, RTA is performed again in an $N_2$ atmosphere to cause a reaction again between the CoSi layer and silicon to form $CoSi_2$ layers 32 of low resistance on each surface of the gate electrode 20, separator 21, n-type source region 25, n-type drain region 26, and body contact region 30. This completes the basic structure of the SOI-MOSFET.

In this case, the height of the sidewalls 22 formed on the side faces of the separator 21 becomes greater due to the presence of the thick portion 18, so at the time of the siliciding reaction, the cobalt film 31 on the surface of the sidewalls 22 will not become silicided. Therefore, the separators 21 of the adjoining elements are never electrically connected through the silicide layer formed on the sidewalls 22. As a result, the pitch between elements can be shortened.

Further, since the separator 21 is made a thickness of an extent acting as a mask at the time of ion implantation, the thickness of the gate electrode 20 also becomes thicker as a result. Therefore, the sidewalls 22 of the side faces of the gate electrode 20 also become higher, so short-circuits between $CoSi_2$ layers 32 can also be prevented.

Further, since the thick portion 18 is present directly below the separator 21, the parasitic capacitance derived from the separator 21 can be reduced by a great degree. Due to this, the gate delay can also be reduced.

Note that the two-step process for forming the thick portion 18 does not result in an increase in the number of steps since it forms the same process as that for forming the high breakdown voltage transistors comprising the peripheral circuits.

Figure 7:
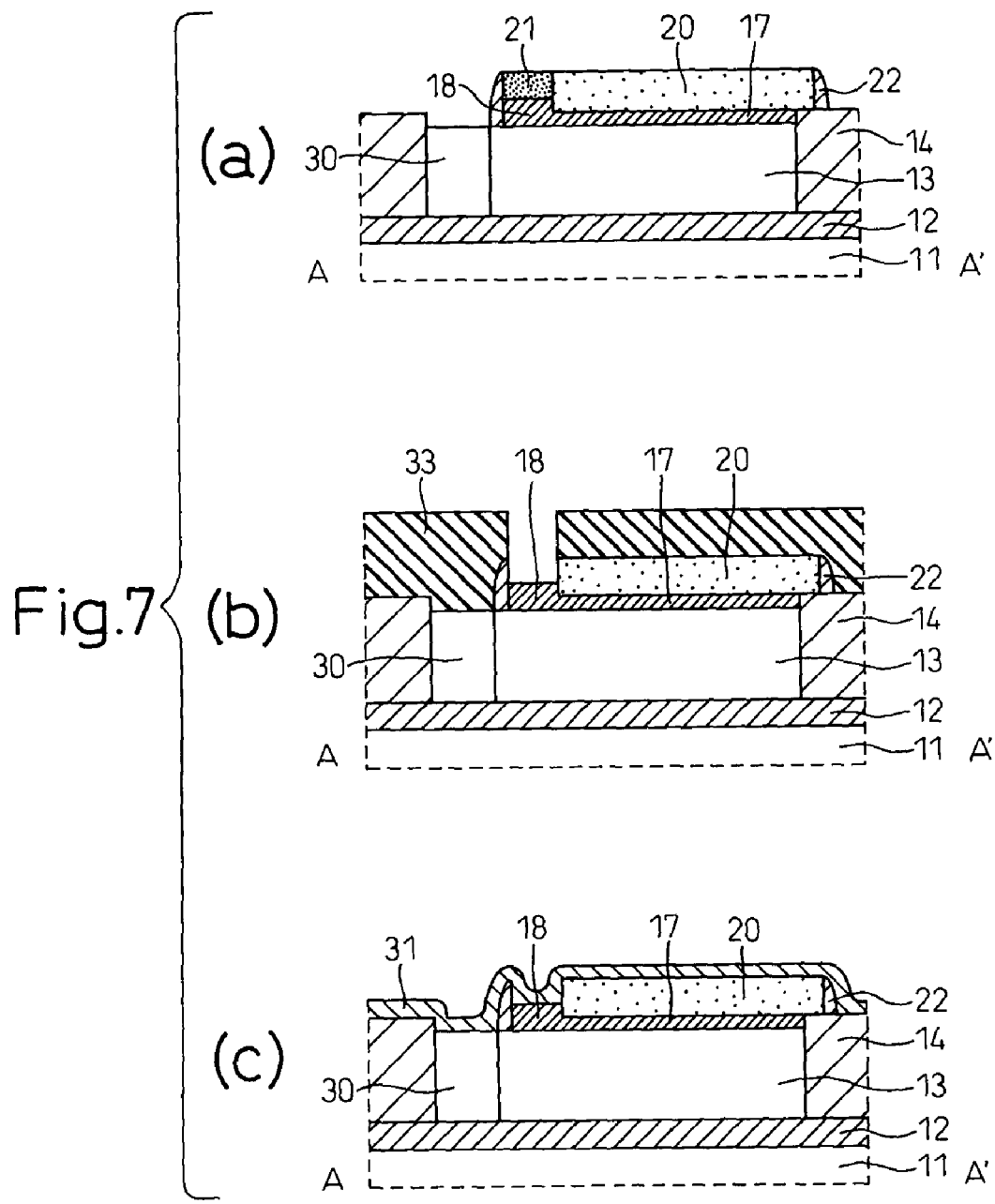
FIG. 7 is an explanatory view of the production process up to the middle of a second embodiment of the present invention.
Figure 8:
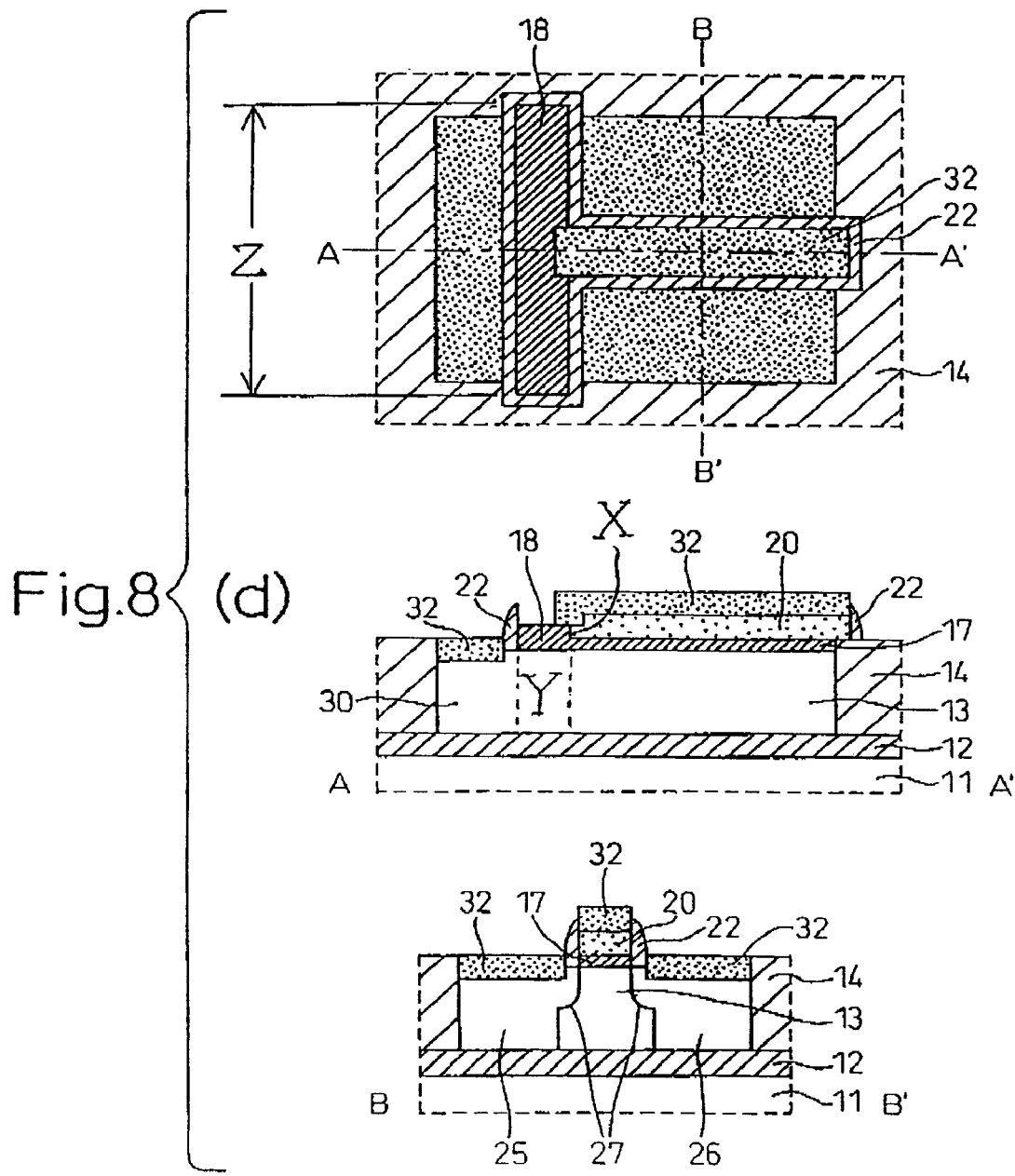
FIG. 8 is an explanatory view of the production process up to the middle of the second embodiment of the present invention after FIG. 7.
Figure 9:
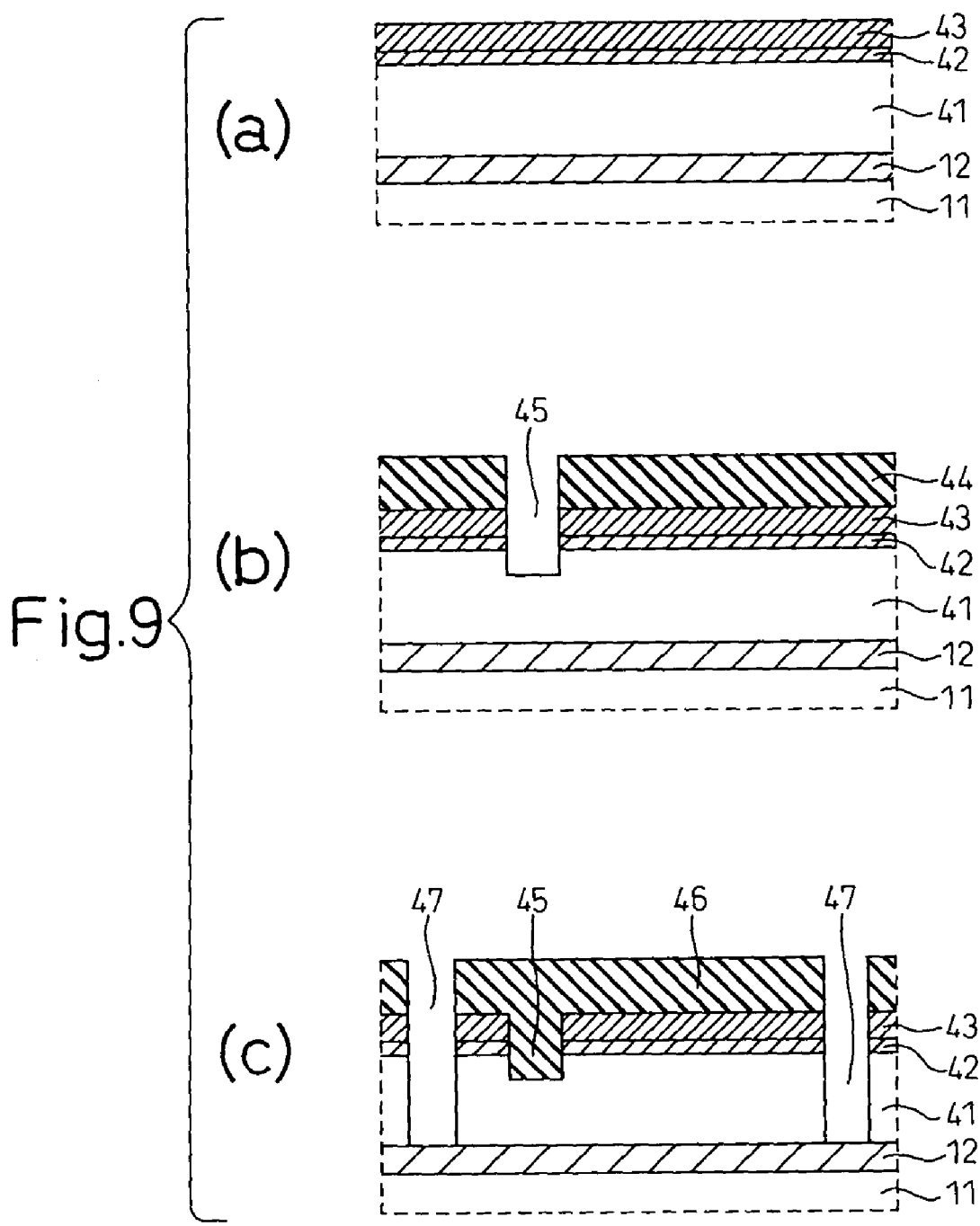
FIG. 9 is an explanatory view of the production process up to the middle of a third embodiment of the present invention.
Figure 10:
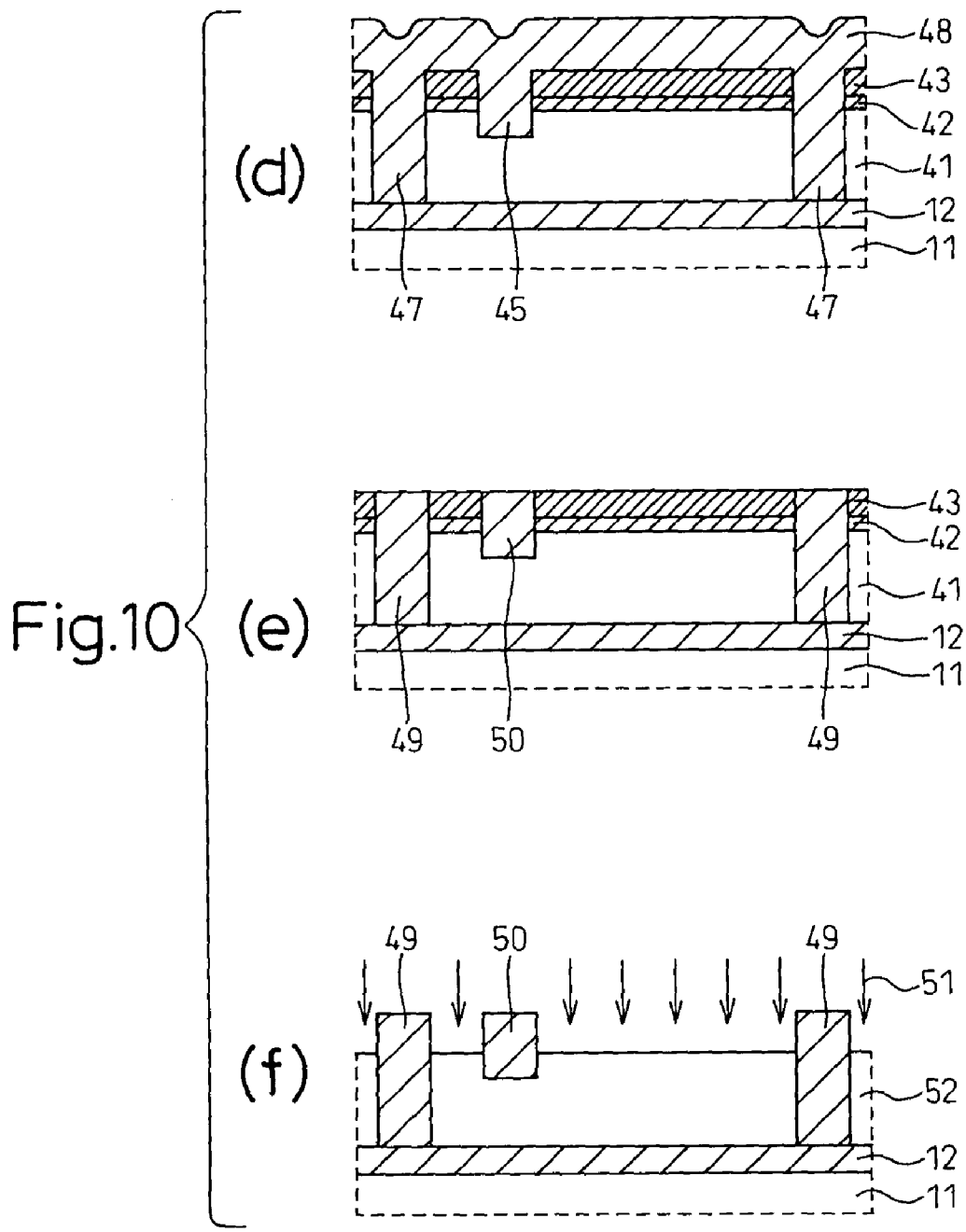
FIG. 10 is an explanatory view of the production process up to the middle of the third embodiment of the present invention after FIG. 9.
Figure 11:
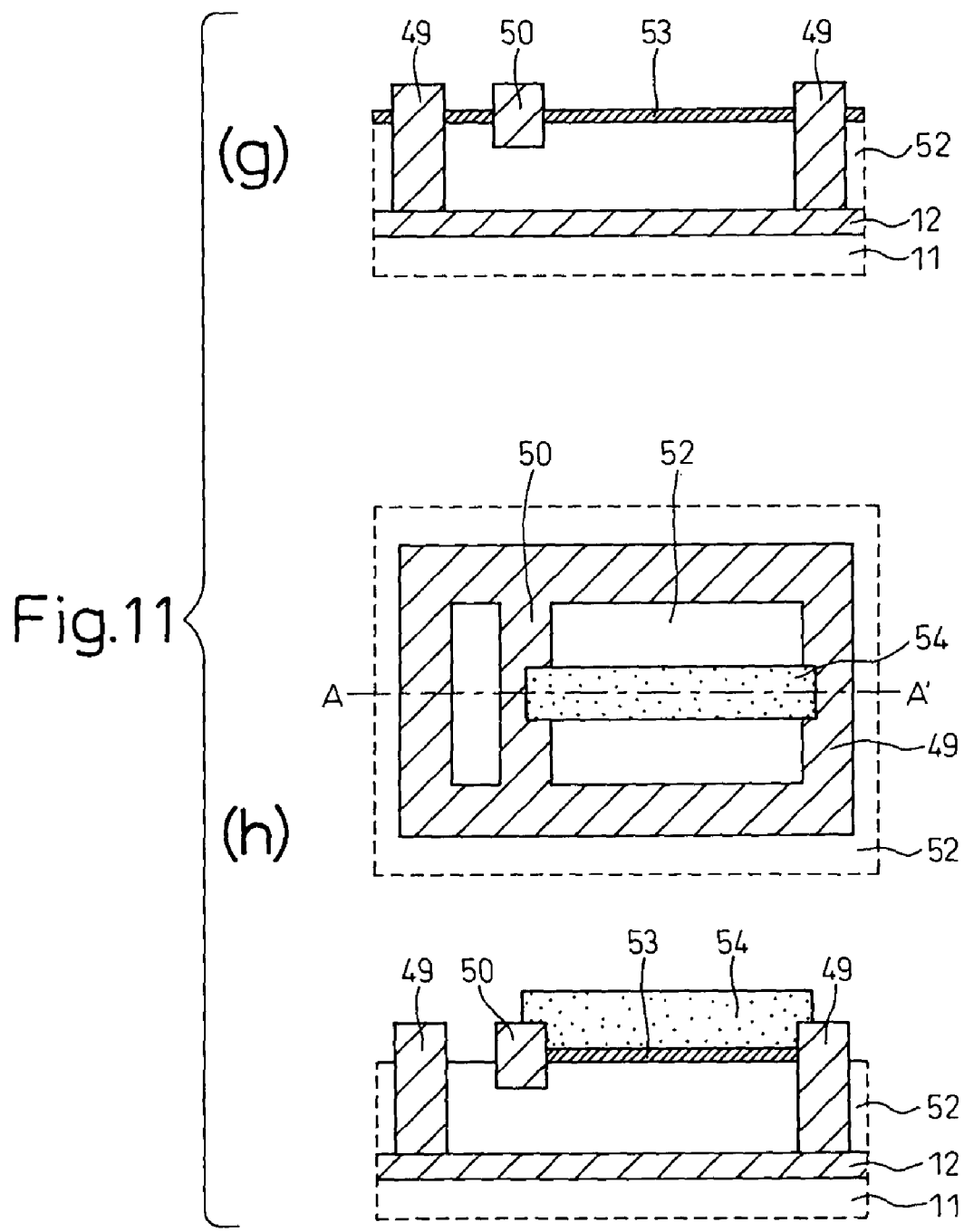
FIG. 11 is an explanatory view of the production process up to the middle of the first embodiment of the present invention after FIG. 10.
Figure 12:
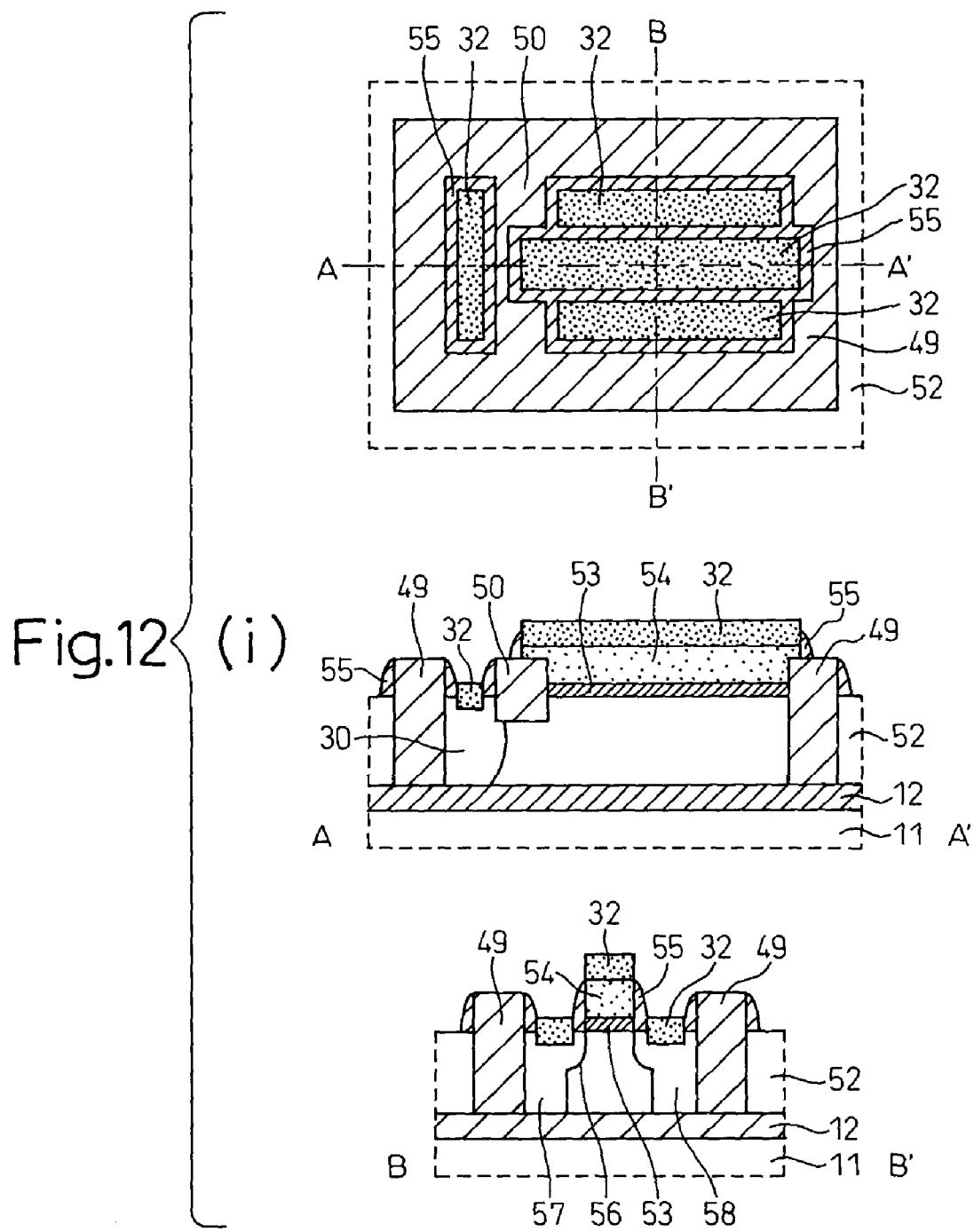
FIG. 12 is an explanatory view of the production process up to the middle of the third embodiment of the present invention after FIG. 11.

Next, an explanation will be made of the process of production of an SOI-MOSFET according to a second embodiment of the present invention with reference to FIG. 7 and FIG. 8.

First, in FIG. 7(a), in exactly the same way as the first embodiment, the steps until FIG. 5(f) are carried out to form the body contact region 30, then the resist pattern 28 is removed to obtain the structure of FIG. 7(a).

Next, in FIG. 7(b), this is dry etched, using the resist pattern 33 having an opening of a shape corresponding to the separator 21 as a mask, to thereby selectively remove only the separator 21.

Next, in FIG. 7(c), the resist pattern 33 is removed, then the reminder is washed. Next, a cobalt film 31 is deposited over the entire surface using the sputtering method.

In the washing step, since the thick portion 18 is present at the removed part of the separator 21, the $SiO_2$ film at the removed part will not be removed by etching to expose the p-type silicon layer. Therefore, in that portion, the p-type silicon layer 13 and the cobalt film 31 will never come into contact.

In FIG. 8(d), the top view is a plan view, the middle view is a sectional view along the one-dot chain line connecting A–A' of the plan view, and the bottom view is a sectional view along the one-dot chain line connecting B–B' of the plan view.

Next, RTA is performed in an $N_2$ atmosphere to cause a reaction between the cobalt film 31 and the silicon and form a CoSi layer. Next, etching is performed using a mixture of $H_2SO_4:H_2O_2=3:1$ to remove the unreacted cobalt film on the insulating films such as the element isolation oxide film 14, thick portion 18, and sidewalls 22.

Next, RTA is performed again in an $N_2$ atmosphere to cause a reaction again between the CoSi layer and silicon to form $CoSi_2$ layers 32 of low resistance on each surface of the gate electrode 20, n-type source region 25, n-type drain region 26, and body contact region 30. This completes the basic structure of the SOI-MOSFET.

In the second embodiment, since the separator 21 used as a mask at the time of ion implantation is removed after ion implantation, the parasitic capacitance derived from the separator 21 can be eliminated. As a result, there is no longer any gate delay derived from the separator 21.

Further, in the siliciding step, even if there are a large number of $CoSi_2$ layers 32 formed projecting from the ends of gate electrode 20 in the direction of gate width, the parasitic capacitance does not become a problem since the layers are on the thick portion 18.

Further, since the separator 21 is removed, there is no longer any connecting portion between the gate electrode 20 and separator 21. Therefore, there is no longer any need to consider changes in the transistor characteristics due to such connecting portion.

Next, an explanation will be given of the process of production of an SOI-MOSFET of the third embodiment of the present invention with reference to FIG. 9 to FIG. 12.

First, in FIG. 9(a), oxygen ions are implanted to a predetermined depth in the silicon substrate 11, the heat treatment is performed to convert the oxygen ion implantation region to $SiO_2$ and thereby form the substrate isolation oxide film 12. Next, boron ions are implanted in the surface to form the p-type silicon layer 41. Next, the underlying $SiO_2$ film 42 and the SiN film 43 serving as the stopper in the chemical mechanical polishing (CMP) step are successively formed.

Next, in FIG. 9(b), this is dry etched, using the resist pattern 44 as a mask, to thereby form a shallow trench 45 for separating the body contact formation region and the other regions.

Next, in FIG. 9(c), the resist pattern 44 is removed, then the reminder is dry etched, using a newly provided resist pattern 46 as a mask, to form an element isolation trench 47 having a depth reaching the substrate isolation oxide film 12 surrounding the element formation region.

Next, in FIG. 10(d), an $SiO_2$ film 48 is deposited over the entire surface using the high density plasma (HDP) CVD method so as to completely bury the shallow trench 45 and the element isolation trench 47 by the $SiO_2$ film 48.

Next, in FIG. 10(e), the $SiO_2$ film 48 is polished by the CMP method to remove the $SiO_2$ film 48 until the SiN film 43 is exposed. Due to this, the element isolation oxide film 49 burying the element isolation trench 47 and intra-element isolation oxide film 50 burying the shallow trench 45 are formed.

Next, in FIG. 10(f), the SiN film 43 and the $SiO_2$ film 42 are removed, then boron ions 51 are implanted in the entire surface to convert the silicon layer 41 to a p-type silicon layer 52.

Next, in FIG. 11(g), the gate insulating film 53 comprised of the SiON film is formed on the surface of the element formation region.

In FIG. 11(h), the upper view is a plan view, while the lower view is a sectional view along the one-dot chain line connecting A–A' of the plan view.

Next, an amorphous silicon film of a thickness of for example 180 nm is deposited over the entire surface, then phosphorus ions are implanted. Next, this is annealed to convert this to an n-type polycrystalline silicon film, then this film is dry etched to form a gate electrode 54 of a width of for example 0.18 μm.

Next, this is wet etched to remove the exposed parts of the gate insulating film 53 and expose the surface of the p-type silicon layer 52.

In FIG. 12(i), the top view is a plan view, the middle view is a sectional view along the one-dot chain line connecting A–A' of the plan view, and the bottom view is a sectional view along the one-dot chain line connecting B–B' of the plan view.

Next, the body contact formation region is covered by a resist pattern, then phosphorus ions are implanted. Due to this, an n-type extended diffusion region 56 is formed.

Next, an $SiO_2$ film is deposited over the entire surface, then this is anistropically etched to form sidewalls 55 on the side faces of the gate electrode 54. Next, while masking the body contact formation region by the resist pattern, phosphorus ions are implanted, using the gate electrode 54 and sidewalls 55 as a mask, to form the n-type source region 57 and n-type drain region 58.

Next, the resist pattern is removed, then in the state with the n-type source region 57 and the n-type drain region 58 masked by the resist pattern, boron ions are implanted to form the body contact region 30.

After this, exactly the same process is followed as in the first embodiment so as to form the $CoSi_2$ layers 32 of low resistance on the surfaces of the gate electrode 54, n-type source region 57, n-type drain region 58, and body contact region 30. This completes the basic structure of the SOI-MOSFET.

In the third embodiment, the intra-element isolation oxide film 50 for isolating the body contact formation region is formed beforehand and the thickness of the intra-element isolation oxide film 50 is made one of at least 0.08 μm which substantially prevents the doping of an impurity, so the separator becomes unnecessary. Therefore, in the same way as the above second embodiment, it is possible to eliminate the parasitic capacitance derived from the separator. Further, it is possible to reduce the pitch between elements.

Figure 13:
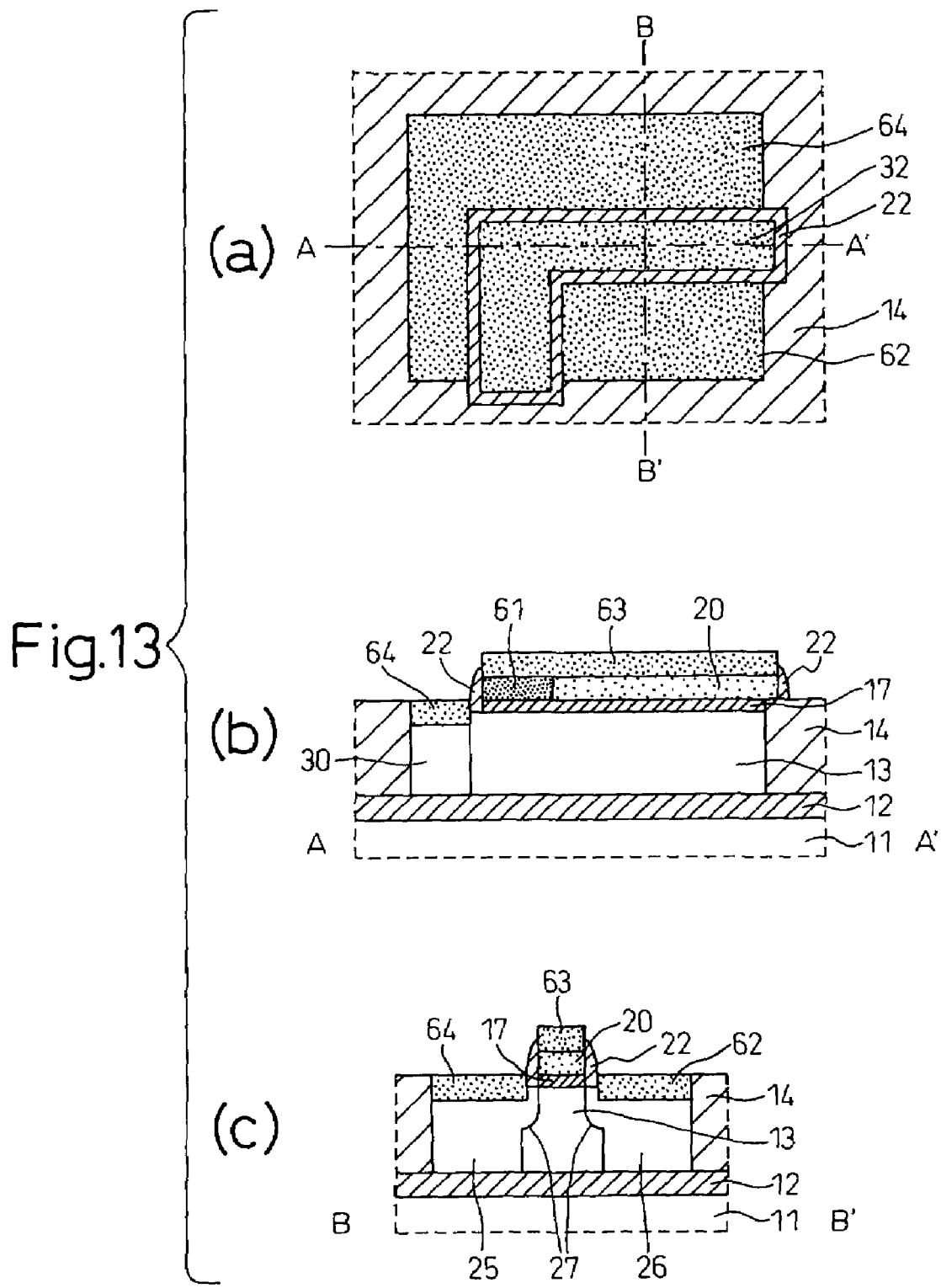
FIG. 13 is an explanatory view of an SOI-MOSFET according to a fourth embodiment of the present invention.

Next, an explanation will be given of an SOI-MOSFET according to a fourth embodiment of the present invention with reference to FIG. 13. The process of production itself is similar to that of the first embodiment except for not forming the thick portion at the gate insulating film, so the explanation thereof will be omitted.

FIG. 13(a) is a plan view, FIG. 13(b) is a sectional view along the one-dot chain line connecting A–A' in FIG. 13(a), and FIG. 13(c) is a sectional view along the one-dot chain line connecting B–B' in FIG. 13(a). Referring to FIGS. 13(a) to 13(c), the SOI-MOSFET according to the fourth embodiment has a separator 61 provided at only the n-type drain region 26 side. Therefore, the p-type body contact region 30 and n-type source region 25 are short-circuited, as a whole, by the $CoSi_2$ layer 64.

That is, in the normal circuit configuration, the source region and the substrate region where the channel is formed are sometimes used at the same potential. The above structure is used in this case. The substrate region, that is, the p-type silicon layer 13, is set to substantially the same potential as the n-type source region 25 through the body contact region 30.

In the fourth embodiment, the separator 61 becomes short, so the parasitic capacitance derived from the separator 61 can be reduced to a great extent. Due to this, the transistor characteristics can be improved.

Further, the area at the side where the separator 61 is removed is reduced.

Figure 14:
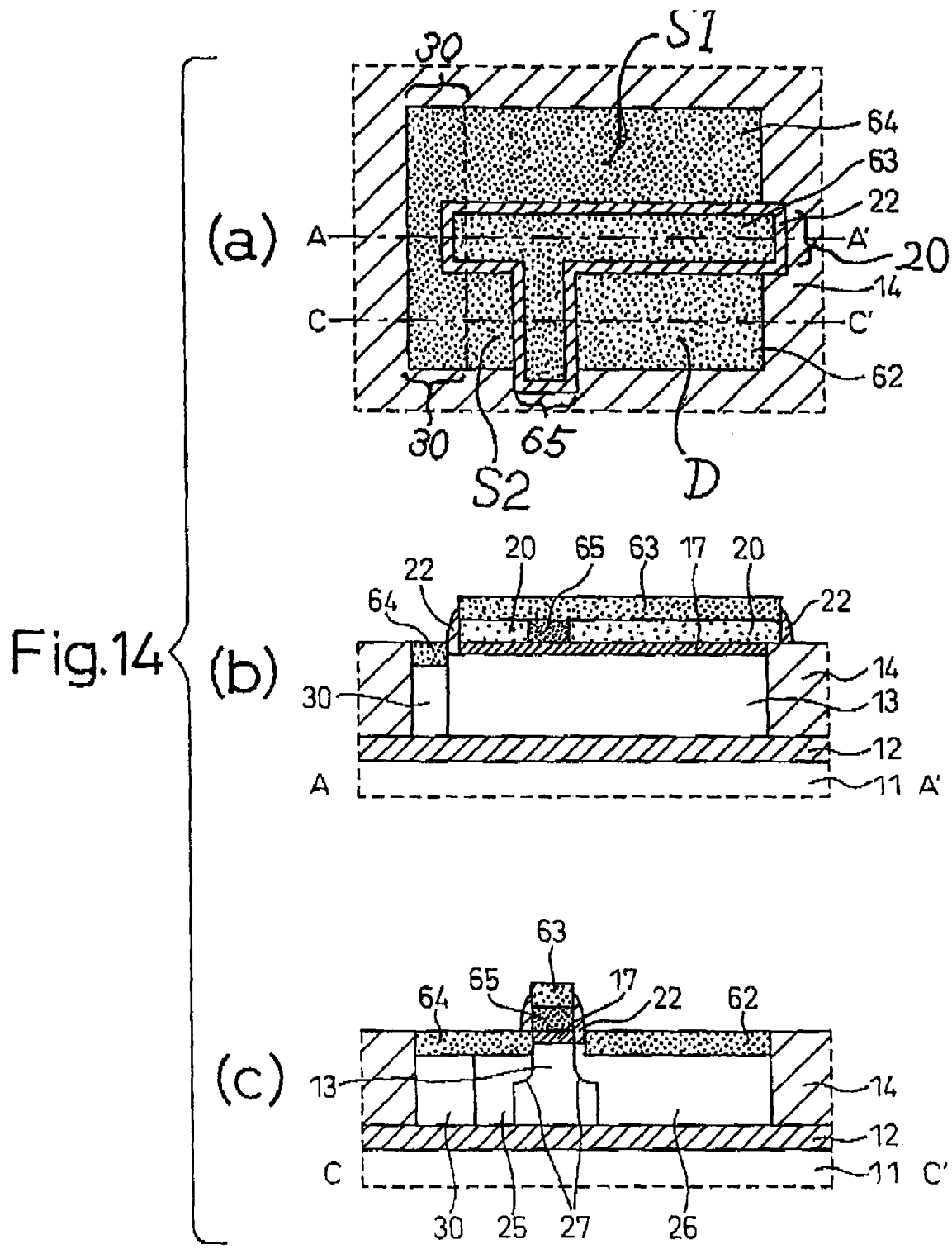
FIG. 14 is an explanatory view of an SOI-MOSFET according to a fifth embodiment of the present invention.

Next, an explanation will be given of an SOI-MOSFET according to a fifth embodiment of the present invention with reference to FIG. 14. The process of production itself has many points in common with the first embodiment, so mainly the points of difference will be explained.

FIG. 14(a) is a plan view, FIG. 14(b) is a sectional view along the one-dot chain line connecting A–A' in FIG. 14(a), and FIG. 14(c) is a sectional view along the one-dot chain line connecting B–B' in FIG. 14(a).

Referring to FIGS. 14(a) to 14(c), the SOI-MOSFET according to the fifth embodiment has a gate electrode 20 projected out somewhat toward the body contact formation region side when patterning the n-type polisilicon layer and has the separator 65 provided at only the drain region formation side.

The resist pattern is provided so that the area near the body contact formation region side of the separator 65 is exposed when forming the source and drain regions. By implanting phosphorus ions using this resist pattern as a mask, an n-type drain region 26 is formed and further an n-type source region 25 is formed as well at both the body contact formation region side of the separator 65 and the region where the separator 65 is not provided.

Next, a resist pattern is provided covering the n-type source region 25 and the n-type drain region 26. By implanting boron ions using the resist pattern as a mask, a body contact region 30 is formed.

After this, a silicide formation step similar to that of the first embodiment is used to form the $CoSi_2$ layers 62 to 64. This completes the basic configuration of the SOI-MOSFET of the fifth embodiment of the present invention.

Note that in this case as well, the p-type body contact region 30 and the n-type source region 25 are short-circuited, as a whole, by the $CoSi_2$ layer 64.

In the fifth embodiment, since the separator 65 functions effectively as a gate electrode, the effective gate width can be lengthened by the amount of the length of the separator 65. Due to this, the transistor characteristics can be improved.

Further, the width of the separator 65 in this case has to be made the same as the width of the gate electrode 20 so as to ensure uniform operating characteristics of the transistors. Along with this, the gate capacitance derived from the separators 65 can be reduced.

While the invention has been described with reference to specific embodiment chosen for purpose of illustration, it should be apparent that numerous modifications could be made thereto by those skilled in the art without departing from the basic concept and scope of the invention.

For example, in the embodiments of the present invention, the SOI structure was formed by the separation-by-implanted-oxygen (SIOX) method, but the substrate bonding method may also be used.

For example, an $SiO_2$ film is formed on the surface of a monocrystalline silicon substrate, then the bonding substrate comprised of a monocrystalline silicon substrate is bonded to the surface of the $SiO_2$ film. Next, this is ground or ordinarily polished to remove the majority of the monocrystalline silicon substrate. Further, the surface is given a mirror finish to thereby provide an element formation layer insulated and isolated from the bonding substrate by the $SiO_2$ film.

Further, in the above embodiments, the element isolation insulating film was formed by the STI method, but the invention is not limited to the STI method. The LOCOS method etc. may also be used. Further, the element isolation insulating film may also be formed before forming the BOX (Buried Oxide).

In particular, in the case of use of the substrate bonding method, element isolation grooves are formed in the monocrystalline silicon substrate, then a CVD-$SiO_2$ film is deposited over the entire surface by the CVD method to bury the element isolation grooves and flatten the surface. Next, the bonding substrate comprised of the monocrystalline silicon substrate is bonded to the surface of the CVD-SiO$_2$ film, then this is ground or normally polished to remove the majority of the monocrystalline silicon substrate and give the surface a mirror finish. Due to this, an SOI substrate provided with an element isolation insulating film may be formed.

Further, in the above first, second, fourth, and fifth embodiments, an SiO$_2$ film formed by thermal oxidation was used as the gate insulating film, but a CVD film is also possible. Further, the invention is not limited to such an SiO$_2$ film. It is also possible to use an SiON film in the same way as in the above third embodiment. Conversely, in the third embodiment, it is also possible to use an SiO$_2$ film as the gate insulating film.

Further, in the above embodiments, an extended diffusion region was provided, but this is not necessarily required. Instead of such an extended diffusion region, an n-type lightly doped drain (LDD) region may also be formed.

Further, in the above embodiments, a CoSi$_2$ layer was formed using a Co film when forming the silicide electrode, but the invention is not limited to such a CoSi$_2$ layer. It is also possible to use a Ti film and use a TiSi$_2$ layer as the silicide electrode.

Further, in the above embodiments, the explanation was simplified by using an n-channel type MOSFET as an example, but the invention may be similarly applied to a p-channel type MOSFET. In particular, it is also possible to provide adjoiningly a p-channel type MOSFET and n-channel type MOSFET separated by an element isolation insulating film and commonly connect the gate electrodes to form a known inverter.

According to the present invention, it is possible to reduce or eliminate the parasitic capacitance derived from the separators and possible to prevent short-circuits between silicide electrodes. Due to this, it becomes possible to prevent short-circuits between the body contact electrode and drain electrode and short-circuits between adjoining separators and possible to reduce the pitch between transistors. This contributes a great deal to the higher degree of integration and faster speed of insulated gate type integrated semiconductor devices.

What is claimed is:

1. An insulated gate type semiconductor device comprised of a semiconductor layer serving as an active region isolated from a semiconductor substrate by a substrate isolation insulating film, provided with a T-shaped gate electrode comprised of a trunk-shaped main gate electrode extending in parallel with respect to said semiconductor substrate, and a crosspiece-shaped conductor pattern extending in parallel with respect to said semiconductor substrate and also extending toward the width direction of said main gate electrode and having a length larger than the width of source and drain regions, and having a thickness of a gate insulating film formed directly under the entire region of the crosspiece-shaped conductor pattern greater than the thickness of the gate insulating film directly under the main gate electrode.

2. An insulated gate type semiconductor device comprised of a semiconductor layer serving as an active region isolated from a semiconductor substrate by a substrate isolation insulating film, wherein a thickness of a first insulating film provided on a surface of a first conductivity type semiconductor region positioned at an interface between a first conductivity type body contact region, for draining carriers stored at a channel region under a gate electrode, and a second conductivity type source and drain regions is made greater than the thickness of a second insulating film, acting as a gate insulating film, with a uniform thickness directly under said gate electrode, said gate electrode being provided on the region except for said body contact region, said first insulating film abutting against the one end of said gate electrode and extending in a direction perpendicular to said gate electrode along said interface.

3. An insulated gate type semiconductor device as set forth in claim 2, said first insulating film is formed as a buried insulating film.

4. An insulated gate type semiconductor device comprised of a semiconductor layer serving as an active region isolated from a semiconductor substrate by a substrate isolation insulating film, said active region including a first conductivity type body contact region and second conductivity type source and drain regions, said body contact region contacting with said source region, wherein a gate electrode of a shape of asymmetric T-shape comprised of a trunk-shaped main gate electrode extending in parallel with respect to said semiconductor substrate, and a crosspiece-shaped conductor pattern extending in parallel with respect to said semiconductor substrate and also extending toward the width direction of said main gate electrode is provided above said active region and, said trunk-shaped main gate electrode is sandwiched between said source region formed without contacting with said crosspiece-shaped conductor pattern and said drain region, and at least part of said crosspiece-shaped conductor pattern is also sandwiched between said source region formed between said crosspiece-shaped conductor pattern and said body contact region and said drain region, and thereby at least part of said crosspiece-shaped conductor pattern functions as an effective gate electrode.

* * * * *